US010662376B2

United States Patent
Nitta et al.

(10) Patent No.: US 10,662,376 B2
(45) Date of Patent: May 26, 2020

(54) PHOSPHOR THAT INCLUDES CRYSTAL PHASE CONTAINING CELIUM

(71) Applicant: Panasonic Intellectual Property Management Co., Ltd., Osaka (JP)

(72) Inventors: Mitsuru Nitta, Kyoto (JP); Nobuaki Nagao, Gifu (JP); Yasuhisa Inada, Osaka (JP)

(73) Assignee: Panasonic Intellectual Property Managment Co., Ltd., Osaka (JP)

( * ) Notice: Subject to any disclaimer, the term of this patent is extended or adjusted under 35 U.S.C. 154(b) by 0 days.

(21) Appl. No.: 16/190,495

(22) Filed: Nov. 14, 2018

(65) Prior Publication Data
US 2019/0233727 A1    Aug. 1, 2019

(30) Foreign Application Priority Data

Jan. 31, 2018    (JP) ................................ 2018-015765

(51) Int. Cl.
| | | |
|---|---|---|
| H01L 33/50 | (2010.01) | |
| C09K 11/77 | (2006.01) | |
| C09K 11/08 | (2006.01) | |
| F21V 9/30 | (2018.01) | |
| F21Y 115/30 | (2016.01) | |

(52) U.S. Cl.
CPC ...... *C09K 11/7774* (2013.01); *C09K 11/0883* (2013.01); *C09K 11/7721* (2013.01); *F21V 9/30* (2018.02); *H01L 33/502* (2013.01); *F21Y 2115/30* (2016.08); *H01L 33/504* (2013.01)

(58) Field of Classification Search
None
See application file for complete search history.

(56) References Cited

U.S. PATENT DOCUMENTS

| | | | |
|---|---|---|---|
| 2006/0186377 A1* | 8/2006 | Takahashi .......... | C09K 11/7774 252/301.4 F |
| 2008/0157653 A1* | 7/2008 | Schmidt ................ | C04B 35/584 313/503 |
| 2015/0159085 A1* | 6/2015 | Izawa ................... | H01L 33/502 362/84 |

FOREIGN PATENT DOCUMENTS

| | | |
|---|---|---|
| JP | 2006-008721 | 1/2006 |
| JP | 2008-088362 | 4/2008 |
| WO | 2018/120124 A1 | 7/2018 |

OTHER PUBLICATIONS

The Extended European Search Report dated Jul. 5, 2019 for the related European Patent Application No. 18211103.9.

* cited by examiner

*Primary Examiner* — Herve-Louis Y Assouman
(74) *Attorney, Agent, or Firm* — Renner, Otto, Boisselle & Sklar, LLP

(57) ABSTRACT

A phosphor comprises a crystal phase with a chemical composition $(Lu_{1-p-q}, Ce_p, M_q)_x \beta_y \gamma_z O$. M denotes one or more elements selected from the group consisting of Y, La, Sc, Pr, Nd, Sm, Eu, Gd, Tb, Dy, Ho, Er, Tm, and Yb. β contains Si, which constitutes 90% or more by mole of β. γ contains N, which constitutes 90% or more by mole of γ. The variables x, y, z, p, and q satisfy $5.5 \leq x \leq 6.5$, $10.5 \leq y \leq 11.5$, $19.5 \leq z \leq 20.5$, $0 < p < 0.03$, and $0 \leq q \leq 0.5$.

14 Claims, 14 Drawing Sheets

PHOSPHOR THAT INCLUDES CRYSTAL PHASE CONTAINING CELIUM

BACKGROUND

1. Technical Field

The present disclosure relates to a phosphor and a light-emitting apparatus.

2. Description of the Related Art

In recent years, solid-state light sources, such as white-light-emitting diodes (LEDs) and organic electroluminescence (EL), have been widely used. Existing typical white LEDs include a combination of a blue LED chip, which is a blue-light-emitting device, and a phosphor. In such typical white LEDs, light from a blue LED chip is partly subjected to color conversion with a phosphor, and blue light from the blue LED chip and light from the phosphor are mixed to produce white light. At present, a combination of a blue LED chip and a yellow phosphor is most commonly used. Yellow phosphors containing Ce as a luminescent center, such as represented by the general formula $Y_3Al_5O_{12}$:$Ce^{3+}$ (hereinafter abbreviated to YAG) or represented by the general formula $La_3Si_6N_{11}$:$Ce^{3+}$ (hereinafter abbreviated to LSN) described in Japanese Patent No. 4459941, are known. In order to improve color rendering properties and color reproducibility or in order to produce low-color-temperature white, white-light sources including a red phosphor in addition to a blue light source and a yellow phosphor are being developed. Also known are red phosphors containing Eu as a luminescent center, such as represented by the general formula (Sr, Ca)AlSiN$_3$:$Eu^{2+}$ (hereinafter abbreviated to CASN) described in Japanese Patent No. 3837588. In more recent years, high-power white-light-emitting apparatuses including a combination of a laser diode (LD) and a phosphor have been developed.

The yellow phosphor YAG has high emission quantum efficiency, which is almost unchanged even when excited by high-power LEDs or LDs, and is therefore used in almost all white-light sources. The red phosphor CASN has the problem of low emission quantum efficiency when excited by high-energy light. This is because phosphors containing Eu as a luminescent center have a longer emission lifetime than phosphors containing Ce as a luminescent center and therefore tend to reach luminance saturation during high-energy excitation. Thus, the emission color varies with the amount of light from an excitation light source. The emission color also varies with degradation of either of the phosphors.

LDs have a much narrower full width at half maximum than LEDs. Thus, in a combination of a blue LD and a conventional yellow phosphor, there is a light loss problem in a wavelength region (particularly in the wavelength range of not less than 455 nm and not more than 500 nm) between the LD light emission and the yellow phosphor light emission.

SUMMARY

One non-limiting and exemplary embodiment provides a phosphor that can constitute a white-light source with reduced light loss in a wavelength region in the range of not less than 455 nm and not more than 500 nm and with improved color rendering properties.

In one general aspect, the techniques disclosed here feature a phosphor that contains a crystal phase with a chemical composition $(Lu_{1-p-q}, Ce_p, M_q)_x\beta_y\gamma_zO$. M denotes one or more elements selected from the group consisting of Y, La, Sc, Pr, Nd, Sm, Eu, Gd, Tb, Dy, Ho, Er, Tm, and Yb. $\beta$ contains Si, which constitutes 90% or more by mole of $\beta$. $\gamma$ contains N, which constitutes 90% or more by mole of $\gamma$. The variables x, y, z, p, and q satisfy $5.5 \leq x \leq 6.5$, $10.5 \leq y \leq 11.5$, $19.5 \leq z \leq 20.5$, $0 < p < 0.03$, and $0 \leq q \leq 0.5$.

It should be noted that general or specific embodiments of the present disclosure may be implemented as a phosphor, a device, an apparatus, a system, a vehicle, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

SUMMARY OF ASPECT OF PRESENT DISCLOSURE

Figure 1:
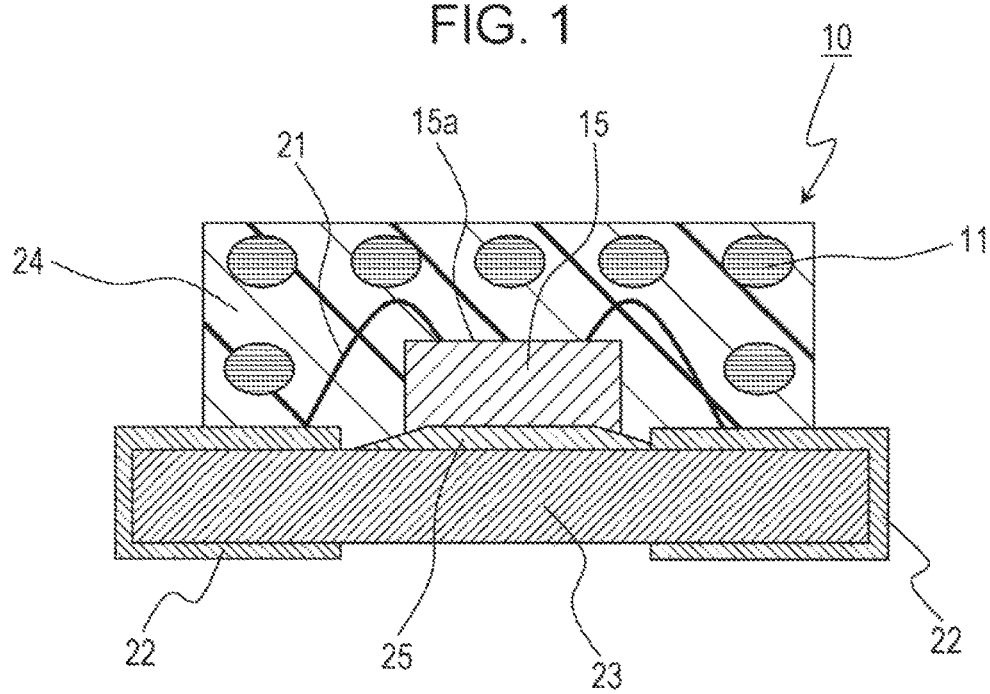
FIG. 1 is a schematic cross-sectional view of an LED light-emitting apparatus according to a third embodiment.

A phosphor according to a first aspect of the present disclosure contains a crystal phase with a chemical composition $(Lu_{1-p-q}, Ce_p, M_q)_x\beta_y\gamma_zO$. M denotes one or more elements selected from the group consisting of Y, La, Sc, Pr, Nd, Sm, Eu, Gd, Tb, Dy, Ho, Er, Tm, and Yb. $\beta$ contains Si, which constitutes 90% or more by mole of $\beta$. $\gamma$ contains N, which constitutes 90% or more by mole of $\gamma$. The variables x, y, z, p, and q satisfy $5.5 \leq x \leq 6.5$, $10.5 \leq y \leq 11.5$, $19.5 \leq z \leq 20.5$, $0 < p < 0.03$, and $0 \leq q \leq 0.5$.

The first aspect of the present disclosure can provide a phosphor that contains Ce as a luminescent center and that has a wide emission spectrum. Thus, a phosphor according to the first aspect can constitute a white-light source with reduced light loss in a wavelength region in the range of not less than 455 nm and not more than 500 nm and with improved color rendering properties.

In a second aspect, for example, a phosphor according to the first aspect has an emission spectrum with a peak in the wavelength range of not less than 540 nm and not more than 600 nm.

A phosphor according to the second aspect can emit yellow light. The emission spectrum may have the peak alone or may have a plurality of peaks including the peak. If the emission spectrum has a plurality of peaks, the peak may or may not be the maximum peak.

In a third aspect, for example, the peak in the emission spectrum of a phosphor according to the second aspect is in the wavelength range of not less than 550 nm and not more than 600 nm.

A phosphor according to the third aspect can be a yellow phosphor.

In a fourth aspect, for example, the peak in the emission spectrum of a phosphor according to the second or third aspect has a full width at half maximum of 130 nm or more.

In a phosphor according to the fourth aspect, the emission spectrum has a wide peak wavelength region. Thus, a phosphor according to the fourth aspect has a spectrum similar to the spectrum of sunlight (that is, natural light) and can therefore constitute a white-light source with improved color rendering properties.

In a fifth aspect, for example, a wavelength component at 500 nm in the emission spectrum of a phosphor according to any one of the second to fourth aspects has an intensity that is equal to or more than 25% of the intensity of the peak.

Light emitted from a phosphor according to the fifth aspect contains light having relatively high intensity around 500 nm wavelength. Thus, a phosphor according to the fifth aspect, even when used in combination with a blue LD as an excitation light source having a narrow full width at half maximum at the emission wavelength, can efficiently constitute a white-light source with reduced light loss in a wavelength region in the range of not less than 455 nm and not more than 500 nm and with improved color rendering properties.

In a sixth aspect, for example, the intensity of the wavelength component at 500 nm in the emission spectrum of a phosphor according to the fifth aspect is less than 100% of the intensity of the peak.

A phosphor according to the sixth aspect, even when used in combination with a blue LD as an excitation light source having a narrow full width at half maximum at the emission wavelength, can further efficiently constitute a white-light source with reduced light loss in a wavelength region in the range of not less than 455 nm and not more than 500 nm and with improved color rendering properties.

In a seventh aspect, for example, a phosphor according to any one of the first to sixth aspects has an excitation spectrum with a first peak in the wavelength range of not less than 360 nm and not more than 390 nm and with a second peak in the wavelength range of not less than 410 nm and not more than 440 nm.

A phosphor according to the seventh aspect, which has two excitation spectrum peaks of the first peak and the second peak, can extend the choice of excitation light sources. The excitation spectrum may or may not have a peak other than the first and second peaks.

In an eighth aspect, for example, an intensity of the first peak in the excitation spectrum of a phosphor according to the seventh aspect is greater than an intensity of the second peak.

A phosphor according to the eighth aspect can efficiently emit light upon irradiation with shorter-wavelength excitation light and can therefore extend the choice of excitation light sources. The first peak may or may not be the maximum peak in the excitation spectrum.

In a ninth aspect, for example, M in a phosphor according to any one of the first to eighth aspects contains Y, which constitutes 90% or more by mole of M.

The ninth aspect can provide a phosphor with less impurities. Thus, a phosphor according to the ninth aspect can constitute a white-light source with less light loss in a wavelength region in the range of not less than 455 nm and not more than 500 nm and with better color rendering properties.

In a tenth aspect, for example, in a phosphor according to the ninth aspect, M is Y, $\beta$ is Si, and $\gamma$ is N.

A phosphor according to the tenth aspect can constitute a white-light source with less light loss in a wavelength region in the range of not less than 455 nm and not more than 500 nm and with better color rendering properties.

In an eleventh aspect, for example, the crystal phase in a phosphor according to any one of the first to tenth aspects has a 1/e emission lifetime of 100 ns or less.

A phosphor according to the eleventh aspect has good luminance saturation characteristics and is therefore a promising phosphor with high quantum efficiency even in a high-power operation.

In a twelfth aspect, for example, the crystal phase in a phosphor according to the eleventh aspect has a 1/e emission lifetime of 50 ns or less.

A phosphor according to the twelfth aspect has better luminance saturation characteristics and is therefore a promising phosphor with higher quantum efficiency even in a high-power operation.

A light-emitting apparatus according to the thirteenth aspect of the present disclosure includes an excitation light source that emits light having the wavelength in a range of not less than 440 nm and not more than 460 nm, and a first phosphor that emits light upon excitation by the light emitted from the excitation light source, the first phosphor being a phosphor according to any one of the first to twelfth aspects.

A light-emitting apparatus according to the thirteenth aspect, which includes a phosphor according to any one of the first to twelfth aspects, can be utilized as a white-light source with reduced light loss in a wavelength region in the range of not less than 455 nm and not more than 500 nm and with improved color rendering properties.

In a fourteenth aspect, for example, the excitation light source in a light-emitting apparatus according to the thirteenth aspect is an LD.

A light-emitting apparatus according to the fourteenth aspect, which includes an LD as an excitation light source, can produce high power.

A light-emitting apparatus according to a fifteenth aspect of the present disclosure includes an LD light source as an excitation light source that emits light having the wavelength in a range of not less than 440 nm and not more than 460 nm, and a first phosphor containing $Ce^{3+}$ as a luminescent center. The first phosphor emits light upon excitation by the light emitted from the LD light source. The first phosphor has an emission spectrum with a peak in the wavelength range of not less than 550 nm and not more than 600 nm. The full width at half maximum of the peak in the emission spectrum is 130 nm or more. A wavelength component at 500 nm in the emission spectrum has an intensity that is equal to or more than 25% of the intensity of the peak.

A light-emitting apparatus according to the fifteenth aspect can be utilized as a white-light source with reduced light loss in a wavelength region in the range of not less than 455 nm and not more than 500 nm and with improved color rendering properties. The emission spectrum may have the peak alone or may have a plurality of peaks including the peak. If the emission spectrum has a plurality of peaks, the peak may or may not be the maximum peak.

A light-emitting apparatus according to a sixteenth aspect of the present disclosure includes an LD light source as an excitation light source that emits light having the wavelength in a range of not less than 440 nm and not more than 460 nm, and a first phosphor containing $Ce^{3+}$ as a luminescent center. The first phosphor emits light upon excitation by the light emitted from the LD light source. The first phosphor has an emission spectrum with a peak in the wavelength range of not less than 540 nm and not more than 600 nm. The full width at half maximum of the peak in the emission spectrum is 130 nm or more. A wavelength component at 500 nm in the emission spectrum has an intensity that is equal to or more than 25% of the intensity of the peak. A wavelength component at 480 nm in the emission spectrum has an intensity that is equal to or more than 15% of the intensity of the peak.

A light-emitting apparatus according to the sixteenth aspect can be utilized as a white-light source with reduced light loss in a wavelength region in the range of not less than 455 nm and not more than 500 nm and with improved color rendering properties. The emission spectrum may have the peak alone or may have a plurality of peaks including the peak. If the emission spectrum has a plurality of peaks, the peak may or may not be the maximum peak.

In a seventeenth aspect, for example, the first phosphor in a light-emitting apparatus according to the fifteenth or sixteenth aspect contains oxynitride as a base material.

A nitride or oxynitride has high thermal conductivity and is less likely to become hot. Thus, a light-emitting apparatus according to the seventeenth aspect can reduce the decrease in the luminous efficiency of the phosphor caused by temperature quenching.

In an eighteenth aspect, for example, light emitted from a light-emitting apparatus according to any one of the thirteenth to seventeenth aspects is white light that satisfies $0.3 \leq x \leq 0.4$ and $0.3 \leq y \leq 0.4$ in CIE chromaticity coordinates (x, y).

A light-emitting apparatus according to the eighteenth aspect can be utilized as a white-light source with improved color rendering properties. Although a light-emitting apparatus according to the eighteenth aspect can include one or more phosphors other than the first phosphor, even if the light-emitting apparatus includes the first phosphor alone, the light-emitting apparatus can have improved color rendering properties with x and y in the CIE chromaticity coordinates (x, y) satisfying the ranges described above.

In a nineteenth aspect, for example, light emitted from a light-emitting apparatus according to any one of the thirteenth to eighteenth aspects has a color rendering index Ra of 70 or more.

A light-emitting apparatus according to the nineteenth aspect can be utilized as a white-light source with improved color rendering properties. Although a light-emitting apparatus according to the nineteenth aspect can include one or more phosphors other than the first phosphor, even if the light-emitting apparatus includes the first phosphor alone, the light-emitting apparatus can have improved color rendering properties with the color rendering index Ra being 70 or more.

In a twentieth aspect, for example, a light-emitting apparatus according to any one of the thirteenth to nineteenth aspects further includes a second phosphor that emits light upon excitation by the light emitted from the excitation light source. The second phosphor has an emission spectrum with a peak in the wavelength range of not less than 580 nm and not more than 660 nm.

A light-emitting apparatus according to the twentieth aspect, which includes at least two phosphors with different emission wavelengths, can control emission color.

Embodiments of Present Disclosure

Embodiments of the present disclosure will be described in detail below. It should be noted that the present disclosure is not limited to these embodiments, and these embodiments may be appropriately modified without departing from the technical scope of the present disclosure. The same or substantially the same constituents are denoted by the same reference numerals and letters and may not be described again.

First Embodiment

A phosphor according to a first embodiment of the present disclosure will be described below.

A phosphor according to the first embodiment contains a crystal phase with a chemical composition $(Lu_{1-p-q}, Ce_p, M_q)_x \beta_y \gamma_z O$. In the composition formula, M denotes one or two or more elements selected from the group consisting of Y, La, Sc, Pr, Nd, Sm, Eu, Gd, Tb, Dy, Ho, Er, Tm, and Yb. β contains Si, which constitutes 90% or more by mole of β. γ contains N, which constitutes 90% or more by mole of γ. The variables x, y, z, p, and q satisfy $5.5 \leq x \leq 6.5$, $10.5 \leq y \leq 11.5$, $19.5 \leq z \leq 20.5$, $0 < p < 0.03$, and $0 \leq q \leq 0.5$. A phosphor according to the first embodiment will be further described below.

In the chemical composition $(Lu_{1-p-q}, Ce_p, M_q)_x\beta_y\gamma_zO$ (hereinafter also referred to as "the chemical composition"), p satisfies $0<p<0.03$. Because light emission requires Ce, p is greater than 0. In order to increase emission intensity, p is desirably 0.0001 or more, more desirably 0.003 or more. The maximum value of p is not particularly limited as long as the phosphor can emit light. However, an excessively large p results in low emission intensity due to concentration quenching. Thus, the decrease in emission intensity can be reduced when p is less than 0.03. In order to increase emission intensity, p is desirably 0.025 or less, more desirably 0.02 or less.

In the chemical composition, q satisfies $0\le q\le 0.5$. A q value of more than 0.5 results in a large shift in emission peak wavelength toward the longer wavelength and results in low luminance. A q value of more than 0.5 results in a large decrease in emission intensity in the emission wavelength range of 460 nm or more and less than 520 nm and results in light loss in this wavelength range. Thus, q is 0.5 or less. A q value of more than 0 can result in improved crystallinity. Thus, q may satisfy $0<q\le 0.5$.

In the chemical composition, x satisfies $5.5\le x\le 6.5$, may satisfy $5.8\le x\le 6.2$, and may be 6. In other words, in the composition formula, x is $6\pm 0.5$, may satisfy $6\pm 0.2$, or may be 6.

In the chemical composition, y satisfies $10.5\le y\le 11.5$, may satisfy $10.8\le y\le 11.2$, and may be 11. In other words, in the composition formula, y is $11\pm 0.5$, may satisfy $11\pm 0.2$, or may be 11.

In the chemical composition, z satisfies $19.5\le z\le 20.5$ and may satisfy $19.8\le z\le 20.2$. In other words, in the composition formula, z is $20\pm 0.5$, or may satisfy $20\pm 0.2$.

In the chemical composition of a phosphor according to the first embodiment, M may contain Y, which constitutes 90% or more by mole of M. M may be Y, $\beta$ may be Si, and $\gamma$ may be N. Thus, a phosphor according to the first embodiment may contain a crystal phase with the chemical composition $(Lu_{1-p-q}, Ce_p, Y_q)_xSi_yN_zO$.

An emission spectrum of a phosphor according to the first embodiment may have a peak in the wavelength range of not less than 540 nm and not more than 600 nm. For example, an emission spectrum of a phosphor according to the first embodiment may have a peak at a wavelength of 550 nm or more or a peak at a wavelength of 560 nm or more. For example, an emission spectrum of a phosphor according to the first embodiment may have a peak at a wavelength of 590 nm or less or a peak at a wavelength of 580 nm or less.

Light emission from a luminescent center that emits light due to the f-f transition of $Eu^{3+}$, $Sm^{3+}$, or the like has a linear spectrum. This is because the $(4f)^n$ shell is not the outermost shell of the ion, and the presence of eight electrons of $(5s)^2(5p)^6$ outside the $(4f)^n$ shell blocks the effects of the crystal field. On the other hand, light emission from a luminescent center that emits light due to the f-d transition of $Ce^{3+}$, $Eu^{2+}$, or the like has a broad spectrum. This is because excited electrons are present as (5d) electrons in the outermost shell and are strongly influenced by the crystal field. For $Ce^{3+}$, the ground level $(4f)^1$ has $^2F_{7/2}$ and $^2F_{5/2}$ manifolds due to spin-orbit interaction, and relaxation into the two levels results in light emission with at least two peaks. Thus, the light emission spectrum is typically broader in $Ce^{3+}$ than in $Eu^{2+}$.

Furthermore, $Ce^{3+}$ with oxynitride as a base material has a particularly broad spectrum. An energy level difference between a hybrid orbital with an oxygen ligand for $Ce^{3+}$ and a hybrid orbital with a nitrogen ligand for $Ce^{3+}$ results in a large energy difference between the two ground levels. Thus, $Ce^{3+}$ with oxynitride as a base material has a particularly broad emission spectrum.

In an oxynitride, a site at which $Ce^{3+}$ is substituted may be a site only containing nitrogen as a ligand, a site only containing oxygen as a ligand, or a site containing oxygen and nitrogen as ligands. The effects of the crystal field differ between the sites, and the energy levels of excitation levels differ between the substitution sites. Thus, substitution of $Ce^{3+}$ in the different sites results in a particularly broad emission spectrum.

Light emission from a phosphor according to the first embodiment results from $Ce^{3+}$ with oxynitride as a base material and therefore has a broad spectrum. In other words, a phosphor according to the first embodiment emits light with a wide emission spectrum, which is similar to the spectrum of sunlight (that is, natural light). Thus, a phosphor according to the first embodiment can have improved color rendering properties.

The broad emission spectrum of a phosphor according to the first embodiment can be proved by the fact that an emission spectrum of a phosphor according to the first embodiment has the following characteristics, for example.

In a phosphor according to the first embodiment, the full width at half maximum of a peak in an emission spectrum in the wavelength range of not less than 540 nm and not more than 600 nm is, for example, 130 nm or more, and may be 140 nm or more. When a phosphor according to the first embodiment has an emission spectrum peak with such a wide full width at half maximum, a phosphor according to the first embodiment has an emission spectrum with a wide wavelength region similar to the spectrum of sunlight (that is, natural light), and can consequently have improved color rendering properties. The upper limit of the full width at half maximum of an emission spectrum peak of a phosphor according to the first embodiment is, but not limited to, 200 nm or less, for example.

In an emission spectrum of a phosphor according to the first embodiment, a wavelength component at 500 nm may have an intensity that is equal to or more than 25% or equal to or more than 40% of the intensity of a peak in the wavelength range of not less than 540 nm and not more than 600 nm. In this case, light emitted from a phosphor according to the present embodiment contains light having relatively high intensity around 500 nm wavelength. Thus, a phosphor according to the first embodiment has a broad emission spectrum. Consequently, even when used as an excitation light source in combination with a blue LD that has a narrow full width at half maximum at the emission wavelength, the phosphor can efficiently constitute a white-light source with reduced light loss in a wavelength region in the range of not less than 455 nm and not more than 500 nm and with improved color rendering properties. In an emission spectrum of a phosphor according to the present embodiment, a wavelength component at 500 nm may have an intensity that is less than 100% of the intensity of a peak in the wavelength range of not less than 540 nm and not more than 600 nm. Light with a wavelength in the range of not less than 455 nm and not more than 500 nm is hereinafter also referred to as light in the cyan region.

For example, an excitation spectrum of a phosphor according to the first embodiment has a first peak in the wavelength range of not less than 360 nm and not more than 390 nm and a second peak in the wavelength range of not less than 410 nm and not more than 440 nm. Thus, the presence of two excitation spectrum peaks of the first peak and the second peak can extend the choice of excitation light sources. The first peak may be larger than the second peak. This enables efficient light emission upon irradiation with shorter-wavelength excitation light and can thereby extend the choice of excitation light sources.

<Method for Producing Phosphor>

A method for producing a phosphor according to the first embodiment will be described below. In this example, M in the chemical composition is Y, β is Si, and γ is N.

For example, a Lu-containing compound, a Ce-containing compound, a Y-containing compound, and a Si-containing compound may be used as raw materials, or each of Lu, Ce, Y, and Si may be used alone. Each compound may be a compound that can be converted into a nitride by firing in a nitrogen atmosphere. Alternatively, each compound may be a high-purity (for example, purity of 99% or more) nitride, or a metal alloy. A small amount of fluoride (for example, ammonium fluoride) may be added to promote the reaction.

A Lu compound, a Ce compound, a Y compound, and a Si compound (or Si alone) may be prepared in such a manner as to satisfy the chemical composition $(Lu_{1-p-q}, Ce_p, Y_q)_x Si_y N_z O$. The chemical composition $(Lu_{1-p-q}, Ce_p, Y_q)_x Si_y N_z O$ is, for example, the chemical composition $(Lu_{1-p-q}, Ce_p, Y_q)_6 Si_{11} N_{20} O$ (where $0<p<0.03$, $0\leq q\leq 0.5$). For example, a LuN powder (or a $Lu_2O_3$ powder), a CeN powder (or a $CeO_2$ powder or a $CeF_3$ powder), a YN powder, and a $Si_3N_4$ powder may be used as specific raw materials.

A phosphor according to the first embodiment is produced by firing a mixture of the raw materials. The raw materials may be mixed by wet blending in a solution or by dry blending of dry powders. Industrially commonly used ball mills, medium stirring mills, planetary mills, vibrating mills, jet mills, V-type mixers, and agitators may be used. The firing is performed in a high-pressure nitrogen atmosphere at a temperature in the range of 1500° C. to 2000° C. for approximately 1 to 50 hours. The pressure is typically 3 atm or more, desirably 4 atm or more, or more desirably 8 atm or more. After firing, the phosphor may be washed in a 10% nitric acid solution for 1 hour, for example. The resulting phosphor powder may be ground again in a ball mill or a jet mill and, if necessary, may be washed or classified to adjust the particle size distribution and flowability of the phosphor powder.

<Light-Emitting Apparatus Including Phosphor>

A phosphor according to the first embodiment can be used in light-emitting apparatuses. A light-emitting apparatus according to the first embodiment includes an excitation light source and a first phosphor. The excitation light source emits light having the wavelength in a range of not less than 440 nm and not more than 460 nm. Upon irradiation with light emitted from the excitation light source, the first phosphor produces fluorescence with a longer wavelength than the light emitted from the excitation light source. The first phosphor is a phosphor according to the first embodiment. A light-emitting apparatus with such a structure can have high quantum efficiency even in a high-power operation and can be used as a white-light source with reduced light loss in a wavelength region in the range of not less than 455 nm and not more than 500 nm and with improved color rendering properties.

The excitation light source may also emit light having the wavelength in a range of not less than 360 nm and not more than 440 nm. The excitation light source may also emit light having the wavelength in a range of not less than 360 nm and not more than 390 nm or light having the wavelength in a range of not less than 410 nm and not more than 440 nm. A phosphor according to the first embodiment typically has an excitation spectrum peak in the wavelength range of not less than 360 nm and not more than 440 nm and can therefore be used for efficient excitation. It is desirable to use a phosphor according to the first embodiment with an excitation spectrum peak at a wavelength of 400 nm or more. The excitation light source is an LED or LD, for example.

A light-emitting apparatus according to the first embodiment may further include a second phosphor having an emission spectrum peak in the wavelength range of not less than 580 nm and not more than 660 nm. Upon irradiation with light emitted from the excitation light source, the second phosphor produces fluorescence with a longer wavelength than the light emitted from the excitation light source. The second phosphor may be a phosphor containing a crystal phase with the chemical composition $(Sr, Ca)AlSiN_3$:$Eu^{2+}$, a phosphor containing a crystal phase with the chemical composition $Sr_2Si_5N_8$:$Eu^{2+}$, a phosphor containing a crystal phase with the chemical composition $La_3(Si_{6-x}, Al_x)N_{11-3/x}$:$Ce^{3+}$, a phosphor containing a crystal phase with the chemical composition $Lu_2CaMg_2Si_3O_{12}$:$Ce^{3+}$, a phosphor containing a crystal phase with the chemical composition $(Y, La)_6Si_{11}N_{20}O$:$Ce^{3+}$, or a phosphor containing a crystal phase with the chemical composition $Y_3Si_5N_9O$:$Ce^{3+}$. Light emitted from a phosphor according to the first embodiment may be utilized to excite the second phosphor.

In a light-emitting apparatus including a phosphor according to the first embodiment, the excitation light source and the second phosphor can be freely chosen within the above ranges in accordance with the intended use of the light-emitting apparatus. More specifically, an excitation light source that emits blue light, a phosphor that emits red light, and a phosphor described in the present embodiment (for example, a yellow phosphor) can be combined to produce a high-power light-emitting apparatus with improved color rendering properties.

As described above, a phosphor according to the first embodiment can emit yellow light with a wide full width at half maximum of an emission spectrum peak and can emit light in the cyan region. Thus, even when a blue LD with a narrow full width at half maximum at the emission wavelength is used as an excitation light source, a light-emitting apparatus according to the first embodiment can be utilized as a white-light source with reduced light loss in a wavelength region in the range of not less than 455 nm and not more than 500 nm and with improved color rendering properties.

For example, light emitted from a light-emitting apparatus according to the first embodiment is white light that satisfies $0.3\leq x\leq 0.4$ and $0.3\leq y\leq 0.4$ in CIE chromaticity coordinates (x, y). Light emitted from a light-emitting apparatus according to the first embodiment has a color rendering index Ra of 70 or more, for example. Thus, a light-emitting apparatus according to the first embodiment can be utilized as a white-light source with improved color rendering properties. Although a light-emitting apparatus according to the first embodiment can include one or more phosphors other than the phosphor according to the first embodiment described as the first phosphor, even if the light-emitting apparatus includes the first phosphor alone, the light-emitting apparatus can have improved color rendering properties with x and y in the CIE chromaticity coordinates (x, y) satisfying the ranges described above and/or with a color rendering index Ra of 70 or more.

Second Embodiment

A light-emitting apparatus according to a second embodiment of the present disclosure will be described below.

A light-emitting apparatus according to the second embodiment includes an LD light source as an excitation light source that emits light having the wavelength in a range of not less than 440 nm and not more than 460 nm, and a first phosphor containing $Ce^{3+}$ as a luminescent center.

The first phosphor in a light-emitting apparatus according to the second embodiment emits light upon excitation by the light emitted from the LD light source. The first phosphor may be the following two phosphors (hereinafter referred to as a "first phosphor A" and a "first phosphor B").

First Phosphor A

The first phosphor A has an emission spectrum with a peak in the wavelength range of not less than 550 nm and not more than 600 nm. The full width at half maximum of the peak in the emission spectrum is 130 nm or more and may be 140 nm or more. The upper limit of the full width at half maximum of the peak in the emission spectrum of the first phosphor A is, but not limited to, 200 nm or less, for example. A wavelength component at 500 nm in the emission spectrum of the first phosphor A has an intensity that is equal to or more than 25% of the intensity of the peak.

First Phosphor B

The first phosphor B has an emission spectrum with a peak in the wavelength range of not less than 500 nm and not more than 600 nm. The full width at half maximum of the peak in the emission spectrum is 130 nm or more and may be 140 nm or more. The upper limit of the full width at half maximum of the peak in the emission spectrum of the first phosphor B is, but not limited to, 200 nm or less, for example. A wavelength component at 500 nm in the emission spectrum of the first phosphor B has an intensity that is equal to or more than 25% of the intensity of the peak, and the intensity of the emission spectrum at a wavelength of 480 nm is equal to or more than 15% of the intensity of the peak in the emission spectrum.

In the following description, examples of the "first phosphor" include the first phosphor A and the first phosphor B.

The first phosphor for use in a light-emitting apparatus according to the second embodiment has an emission spectrum with the characteristics described above. More specifically, the first phosphor emits yellow light and light in the cyan region and has a very broad emission spectrum. Thus, although a blue LD with a narrow full width at half maximum at the emission wavelength is used as an excitation light source, a light-emitting apparatus according to the second embodiment can be utilized as a white-light source with reduced light loss in a wavelength region in the range of not less than 455 nm and not more than 500 nm and with improved color rendering properties.

The first phosphor may contain oxynitride as a base material. $Ce^{3+}$ with oxynitride as a base material has a broader emission spectrum. Thus, the first phosphor containing oxynitride as a base material can constitute a white-light source with reduced light loss in a wavelength region in the range of not less than 455 nm and not more than 500 nm and with better color rendering properties.

When the first phosphor for use in a light-emitting apparatus according to the second embodiment has an excitation spectrum with a peak at a wavelength in the range of not less than 360 nm and not more than 440 nm, the LD light source may emit light with a wavelength in the range of not less than 360 nm and not more than 440 nm. In this case, the LD light source may also emit light having the wavelength in a range of not less than 360 nm and not more than 390 nm or light having the wavelength in a range of not less than 410 nm and not more than 440 nm.

A light-emitting apparatus according to the second embodiment may further include a second phosphor having an emission spectrum with a peak in the wavelength range of not less than 580 nm and not more than 660 nm. Upon irradiation with light emitted from the excitation light source, the second phosphor produces fluorescence with a longer wavelength than the light emitted from the excitation light source. The second phosphor may be a phosphor containing a crystal phase with the chemical composition $(Sr, Ca)AlSiN_3:Eu^{2+}$, a phosphor containing a crystal phase with the chemical composition $Sr_2Si_5N_8:Eu^{2+}$, a phosphor containing a crystal phase with the chemical composition $La_3(Si_{6-x}, Al_x)N_{11-3/x}:Ce^{3+}$, a phosphor containing a crystal phase with the chemical composition $Lu_2CaMg_2Si_3O_{12}:Ce^{3+}$, a phosphor containing a crystal phase with the chemical composition $(Y, La)_6Si_{11}N_{20}O:Ce^{3+}$, or a phosphor containing a crystal phase with the chemical composition $Y_3Si_5N_9O:Ce^{3+}$. Light emitted from the first phosphor may be utilized to excite the second phosphor.

The LD light source and the second phosphor in a light-emitting apparatus according to the second embodiment can be freely chosen within the above ranges in accordance with the intended use of the light-emitting apparatus. More specifically, an LD light source that emits blue light, a phosphor that emits red light, and the first phosphor described in the second embodiment (for example, a yellow phosphor) can be combined to produce a high-power light-emitting apparatus with improved color rendering properties.

As described above, the first phosphor for use in a light-emitting apparatus according to the second embodiment can emit yellow light with a wide full width at half maximum of an emission spectrum peak and can emit light in the cyan region. Thus, although a blue LD with a narrow full width at half maximum at the emission wavelength is used as an excitation light source, a light-emitting apparatus according to the second embodiment can be utilized as a white-light source with reduced light loss in a wavelength region in the range of not less than 455 nm and not more than 500 nm and with improved color rendering properties.

For example, light emitted from a light-emitting apparatus according to the second embodiment is white light that satisfies $0.3 \le x \le 0.4$ and $0.3 \le y \le 0.4$ in CIE chromaticity coordinates (x, y). Light emitted from a light-emitting apparatus according to the second embodiment has a color rendering index Ra of 70 or more, for example. Thus, a light-emitting apparatus according to the second embodiment can be utilized as a white-light source with improved color rendering properties. Although a light-emitting apparatus according to the second embodiment can include one or more phosphors other than the first phosphor, even if the light-emitting apparatus includes the first phosphor alone, the light-emitting apparatus can have improved color rendering properties with x and y in the CIE chromaticity coordinates (x, y) satisfying the ranges described above and/or with a color rendering index Ra of 70 or more.

Third Embodiment

An LED light-emitting apparatus that includes an LED chip as a light source is described in a third embodiment as an example of a light-emitting apparatus according to the present disclosure. FIG. 1 is a schematic cross-sectional view of an LED light-emitting apparatus according to the third embodiment. As illustrated in FIG. 1, an LED light-emitting apparatus 10 includes a phosphor 11, an LED chip (an example of an excitation light source) 15, and an LED sealing member 24. The LED light-emitting apparatus 10 may include a support 23. The support 23 supports the LED chip 15. In the present embodiment, the LED light-emitting apparatus 10 has a surface-mountable structure. Thus, the support 23 is a substrate. In the LED light-emitting apparatus 10, the phosphor 11 and the LED sealing member 24 constitute a wavelength convertor.

The present embodiment can be applied to a high-brightness LED light-emitting apparatus. For example, the support 23 has high thermal conductivity so as to efficiently dissipate heat generated by the LED chip 15. For example, the support 23 may be a ceramic substrate formed of alumina or aluminum nitride.

The LED chip 15 emits at least blue light. More specifically, the LED chip 15 emits at least light having the wavelength in a range of not less than 440 nm and not more than 460 nm. The LED chip 15 is fixed to the support 23, for example, with solder 25 such that an output surface 15a is not in contact with the support 23. The LED chip 15 is electrically connected to an electrode 22 on the support 23 via a bonding wire 21. The LED chip 15 is covered with the LED sealing member 24.

The LED sealing member 24 is formed of a silicone resin, for example. The phosphor 11 is dispersed in the LED sealing member 24. The silicone resin may be one of silicone resins with structures represented by various chemical formulae used as sealing resins in semiconductor light-emitting devices. The silicone resin contains color-fast dimethyl silicone, for example. Heat-resistant methylphenyl silicone may also be used as a silicone resin. The silicone resin may be a homopolymer with a siloxane-bonded main skeleton represented by one chemical formula. Alternatively, the silicone resin may be a copolymer with structural units containing a siloxane bond represented by two or more chemical formulae or may be an alloy of two or more silicone polymers.

In the present embodiment, the silicone resin in the LED sealing member 24 is in the cured state. Thus, the LED sealing member 24 is also in the cured state. As described below, the LED sealing member 24 can be produced from an uncured silicone resin. Typical silicone resins are of two-component type in which a main agent and a curing agent are mixed to promote curing. However, a thermosetting silicone resin or an energy-curable silicone resin, which can be cured by irradiation with energy, such as light, may also be used. The LED sealing member 24 may be formed of a material other than silicone resins. For example, glass, an epoxy resin, or an inorganic material composed of ZnO may be used. Instead of being dispersed in the LED sealing member 24, the phosphor 11 may be disposed in the form of a phosphor plate on the LED sealing member 24.

Although the LED chip is wire-bonded in the example, the LED chip used in the present embodiment may have another structure. More specifically, the LED chip used in the present embodiment may be face-up mounted or flip-chip mounted. The LED chip used in the present embodiment may include a light-emitting layer formed of a nitride semiconductor with a growth surface of a general polar plane (c-plane).

<Outline of Phosphor>

The phosphor 11 absorbs part or all of the wavelength components of light emitted from the LED chip 15 and produces fluorescence. The wavelength of light to be absorbed and the wavelength of fluorescence depend on the type of fluorescent material contained in the phosphor 11. The phosphor 11 may be a mixed phosphor containing different color phosphors so as to produce white light by color mixing. The phosphor 11 may be a mixed phosphor of a yellow phosphor and a red phosphor. Examples of the red phosphor include $(Sr, Ca)AlSiN_3:Eu^{2+}$, $Sr_2Si_5N_8:Eu^{2+}$, $La_3(Si_{6-x}, Al_x)N_{11-3/x}:Ce^{3+}$, $Lu_2CaMg_2Si_3O_{12}:Ce^{3+}$, and $(Y, La)_6Si_{11}N_{20}O:Ce^{3+}$ phosphors. The yellow phosphor is a phosphor according to the first embodiment.

In another embodiment, the phosphor 11 may be a mixed phosphor of a yellow phosphor according to the first embodiment, a yellow phosphor other than the phosphor according to the first embodiment, and a red phosphor. Examples of the yellow phosphor other than the phosphor according to the first embodiment include $Y_3Al_5O_{12}:Ce^{3+}$, $CaSi_2O_2N_2:Eu^{2+}$, $(Ba, Sr)Si_2O_2N_2:Eu^{2+}$, $Ca_3Sc_2Si_3O_{12}:Ce^{3+}$, $CaSc_2O_4:Ce^{3+}$, $La_3Si_6N_{11}:Ce^{3+}$, $M^{II}{}_2MgSi_2O_7:Eu^{2+}$ (where $M^{II}$=at least one selected from Ba, Sr, and Ca), $SrSi_5AlO_2N_7:Eu^{2+}$, $SrSi_2O_2N_2:Eu^{2+}$, $BaAl_2O_4:Eu^{2+}$, $BaZrSi_3O_9:Eu^{2+}$, $M^{II}{}_2SiO_4:Eu^{2+}$ (where $M^{II}$=at least one selected from Ba, Sr, and Ca), $BaSi_3O_4N_2:Eu^{2+}$, $Ca_8Mg(SiO_4)_4Cl_2:Eu^{2+}$, $Ca_3SiO_4Cl_2:Eu^{2+}$, and $\beta$-$SiAlON:Eu^{2+}$ phosphors.

The phosphor 11 has a particle size in the range of 1 to 80 μm, for example. The term "particle size", as used herein, refers to the equivalent circular diameter determined by microscopy.

For example, the LED sealing member 24 contains 3 to 70 parts by weight of the phosphor 11 per 100 parts by weight of the sealing member. At least 3 parts by weight of the phosphor 11 can produce fluorescence of sufficient intensity and provide the LED light-emitting apparatus 10 that emits light of a desired wavelength. The weight ratio of color phosphors in the phosphor 11 depends on the desired color tone and the emission intensity of each color phosphor. The LED light-emitting apparatus can be configured to produce a desired color by using the phosphor 11 composed of a phosphor of the first embodiment alone or in combination with one or more other color phosphors.

The phosphors other than the yellow phosphor containing $Ce^{3+}$ as a luminescent center described in the first embodiment can be produced by a known method. More specifically, a raw material used to produce an oxide phosphor may be a compound that forms an oxide by firing, such as a hydroxide, oxalate, or nitrate, or may be an oxide. A small amount of fluoride (for example, calcium fluoride) or chloride (for example, calcium chloride) may be added to promote the reaction. A phosphor is produced by firing a mixture of the raw materials.

The raw materials may be mixed by wet blending in a solvent or by dry blending of dry powders. Industrially commonly used ball mills, medium stirring mills, planetary mills, vibrating mills, jet mills, V-type mixers, and agitators may be used. The phosphor raw materials are fired in the air or in a reducing atmosphere at a temperature in the range of 1100° C. to 1800° C. for approximately 1 to 50 hours. The firing furnace may be an industrially commonly used furnace. For example, a continuous or batch-wise electric furnace or gas furnace, such as a pusher furnace, or a high-pressure furnace of spark plasma sintering (SPS) or hot isostatic pressing (HIP) sintering may be used. The resulting phosphor powder can be ground again in a ball mill or a jet mill and, if necessary, can be washed or classified to adjust the particle size distribution and flowability of the phosphor powder.

As described above, a light-emitting apparatus according to the third embodiment includes an excitation light source that emits blue light, and a yellow phosphor that contains $Ce^{3+}$ as a luminescent center and has a wide emission spectrum according to the first embodiment. Thus, a light-emitting apparatus according to the third embodiment can constitute a high-efficiency light source with improved color rendering properties.

Fourth Embodiment

Figure 2:
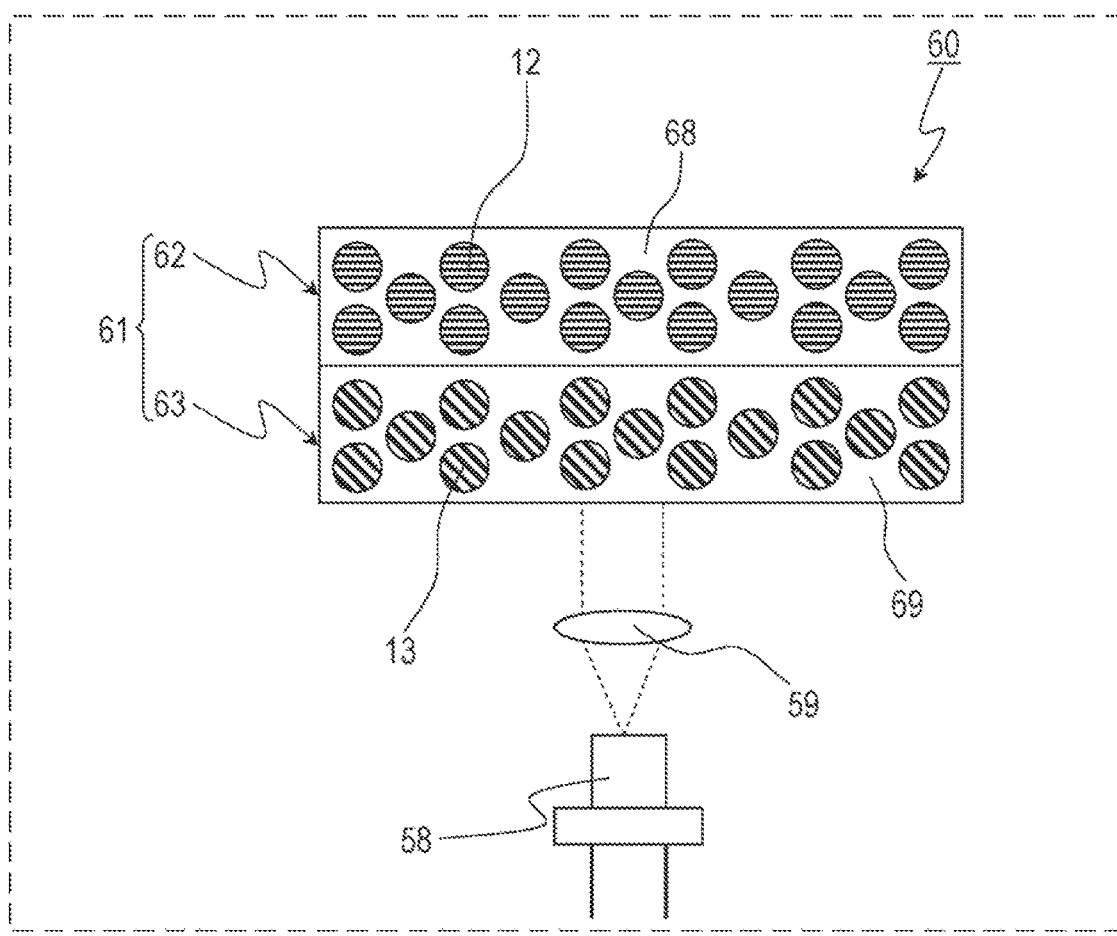
FIG. 2 is a schematic cross-sectional view of an LD light-emitting apparatus according to a fourth embodiment.

An LD light-emitting apparatus that includes an LD as a light source is described in a fourth embodiment as an example of a light-emitting apparatus according to the present disclosure. FIG. 2 schematically illustrates an LD light-emitting apparatus 60 according to the fourth embodiment. The LD light-emitting apparatus 60 includes a LD device (an example of an excitation light source) 58 and a wavelength conversion member (an example of a wavelength convertor) 61. The wavelength conversion member 61 contains a phosphor. The phosphor converts output light emitted from the LD device 58 to light with a longer wavelength.

The LD device 58 can emit light with a higher light power density than LEDs. Thus, the LD device 58 can constitute the LD light-emitting apparatus 60 with high power. In order to increase the power of the LD light-emitting apparatus 60, the light power density of the LD device 58 to irradiate the phosphor is 0.5 W/mm$^2$ or more, for example. The light power density for irradiation of the phosphor may be 2 W/mm$^2$ or more, 3 W/mm$^2$ or more, or 10 W/mm$^2$ or more. However, the light power density for irradiation of the phosphor can be decreased to reduce the amount of heat generation by the phosphor and to reduce the adverse effects on the LD light-emitting apparatus 60. Thus, the light power density for irradiation of the phosphor may be 150 W/mm$^2$ or less, 100 W/mm$^2$ or less, 50 W/mm$^2$ or less, or 20 W/mm$^2$ or less.

The LD device 58 may be an LD device that emits blue light. More specifically, the LD device 58 has an emission spectrum with a peak at least in the wavelength range of not less than 440 nm and not more than 460 nm, desirably in the wavelength range of not less than 420 nm and not more than 460 nm.

The LD device 58 may be composed of one LD or optically coupled LDs. For example, the LD device 58 may include a light-emitting layer formed of a nitride semiconductor with a growth surface of a nonpolar plane or semipolar plane.

A phosphor in the wavelength conversion member 61 includes a phosphor according to the first embodiment. The wavelength conversion member 61 may further contain a phosphor other than the phosphor according to the first embodiment depending on the desired emission color of the light-emitting apparatus. For example, the wavelength conversion member 61 may further contain a red phosphor. The red phosphor may be a red phosphor exemplified in the first embodiment. The wavelength conversion member 61 may be a wavelength conversion layer containing a mixture of phosphors or may be at least two wavelength conversion layers each containing one or more phosphors. In particular, the wavelength conversion member 61 in the present embodiment includes a first phosphor layer 63 containing a phosphor according to the first embodiment and a second phosphor layer 62 containing a red phosphor.

The second phosphor layer 62 and the first phosphor layer 63 contain binders 68 and 69, respectively. The binders 68 and 69 may be a medium such as a resin, glass, or transparent crystal. The binders 68 and 69 may be the same material or different materials. Each phosphor layer may be composed of phosphor particles alone.

An incident optical system 59 for directing light from the LD device 58 to the first phosphor layer 63 may be disposed between the wavelength conversion member 61 and the LD device 58. The incident optical system 59 includes a lens, a mirror, or an optical fiber, for example.

The operation of the LD light-emitting apparatus 60 according to the present embodiment will be described below. Blue light emitted from the LD device 58 is incident on the first phosphor layer 63 of the wavelength conversion member 61 through the incident optical system 59. The incident light excites a yellow phosphor 13 in the first phosphor layer 63 and induces the emission of yellow light. Blue light emitted from the LD device 58 and passing through the first phosphor layer 63 without absorption is incident on the second phosphor layer 62. The incident light excites the red phosphor in the second phosphor layer 62 and induces the emission of red light. The yellow light emitted from the first phosphor layer 63 is incident on the second phosphor layer 62. Part of the incident light may excite the red phosphor 12 in the second phosphor layer 62 and induce the emission of red light. Blue light emitted from the LD device 58 and passing through the first phosphor layer 63 and the second phosphor layer 62 without absorption is emitted outward. Mixed light of the red light, yellow light, and blue light is emitted from the LD light-emitting apparatus 60.

The thickness of each phosphor layer may be adjusted such that blue light emitted from the LD device 58 does not pass through the second phosphor layer 62.

A light-emitting apparatus according to the fourth embodiment, which includes an excitation light source that emits blue light and a phosphor according to the first embodiment, as described above, can constitute a high-power light source with improved color rendering properties.

Fifth Embodiment

Figure 3:
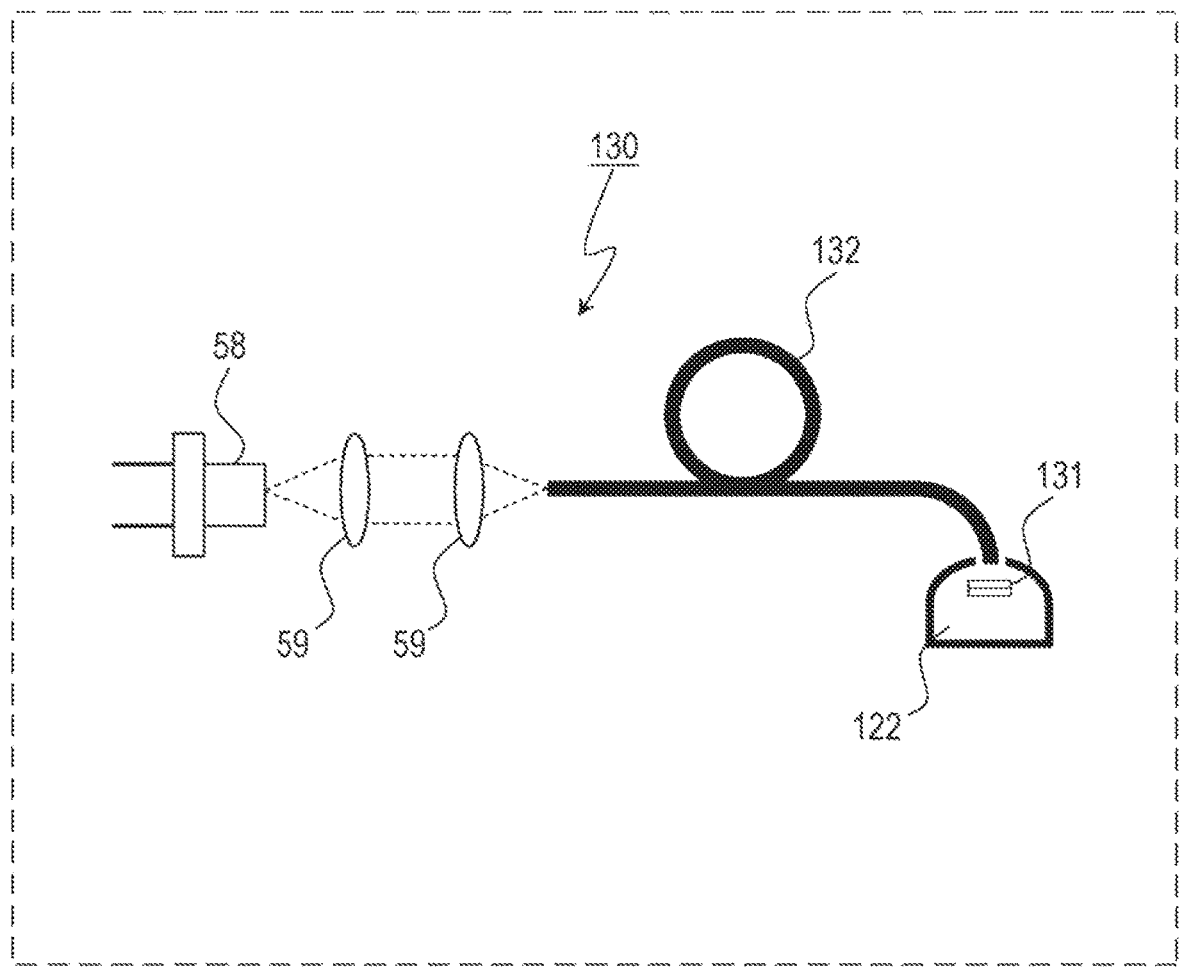
FIG. 3 is a schematic cross-sectional view of a lighting apparatus according to a fifth embodiment.
Figure 4:
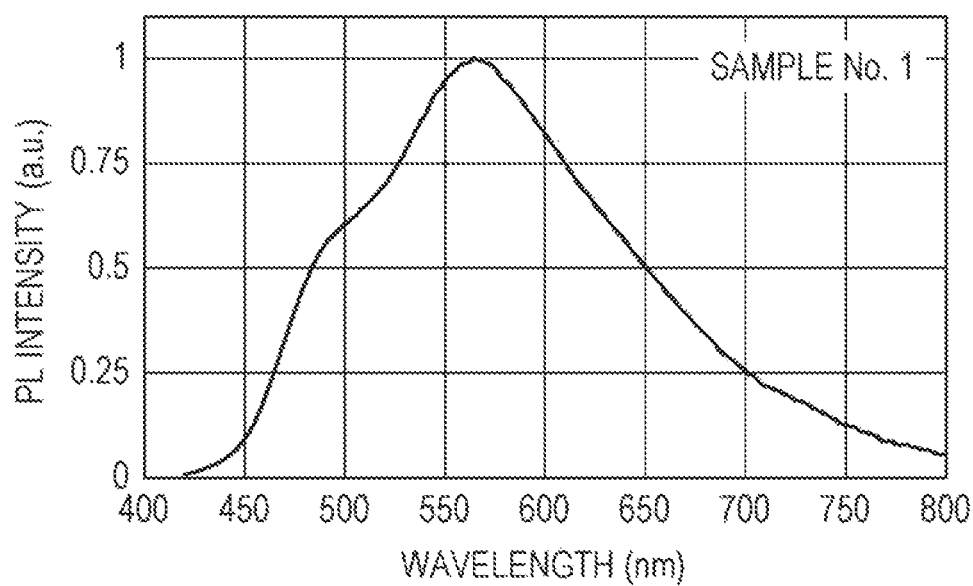
FIG. 4 is an emission spectrum of a phosphor of sample No. 1.
Figure 5:
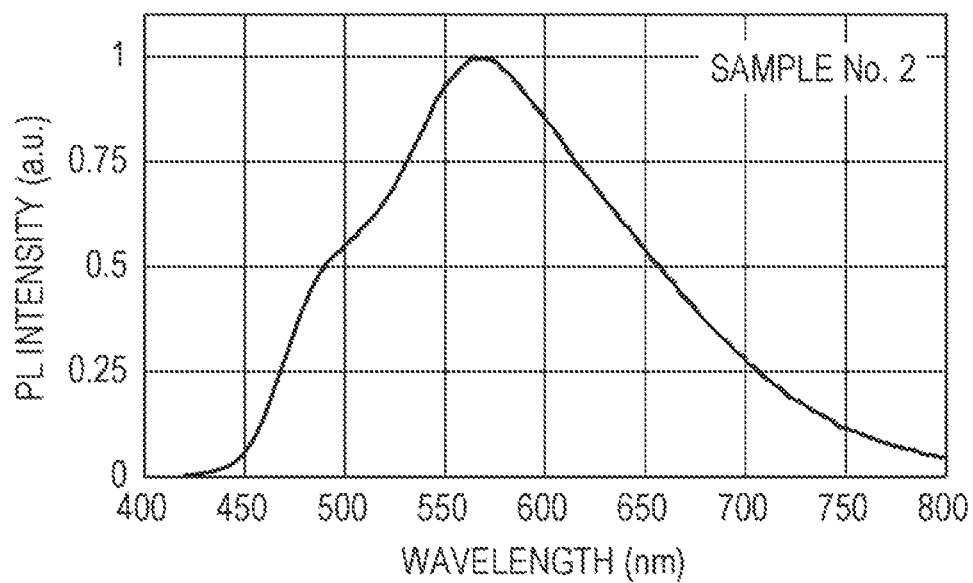
FIG. 5 is an emission spectrum of a phosphor of sample No. 2.
Figure 6:
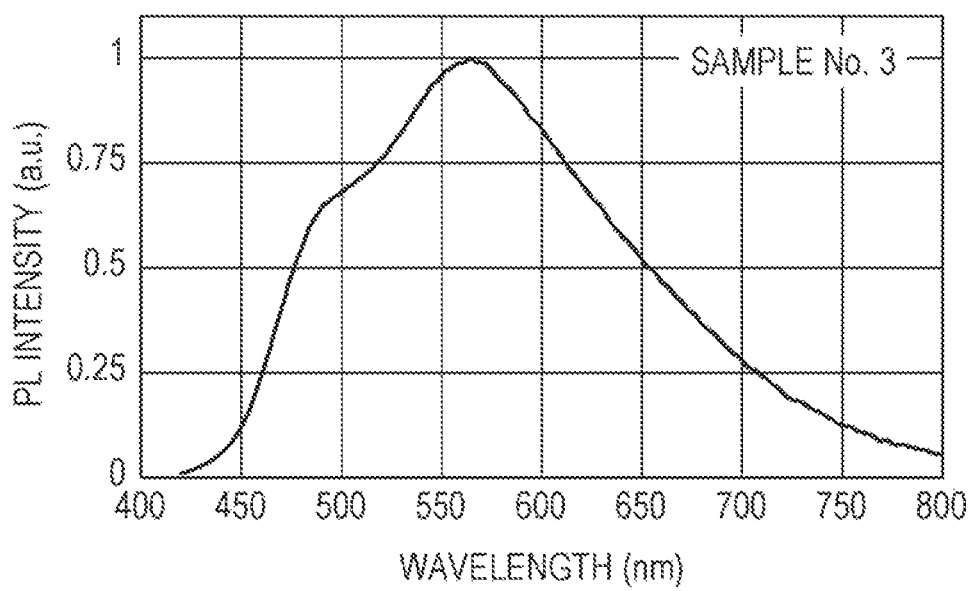
FIG. 6 is an emission spectrum of a phosphor of sample No. 3.
Figure 7:
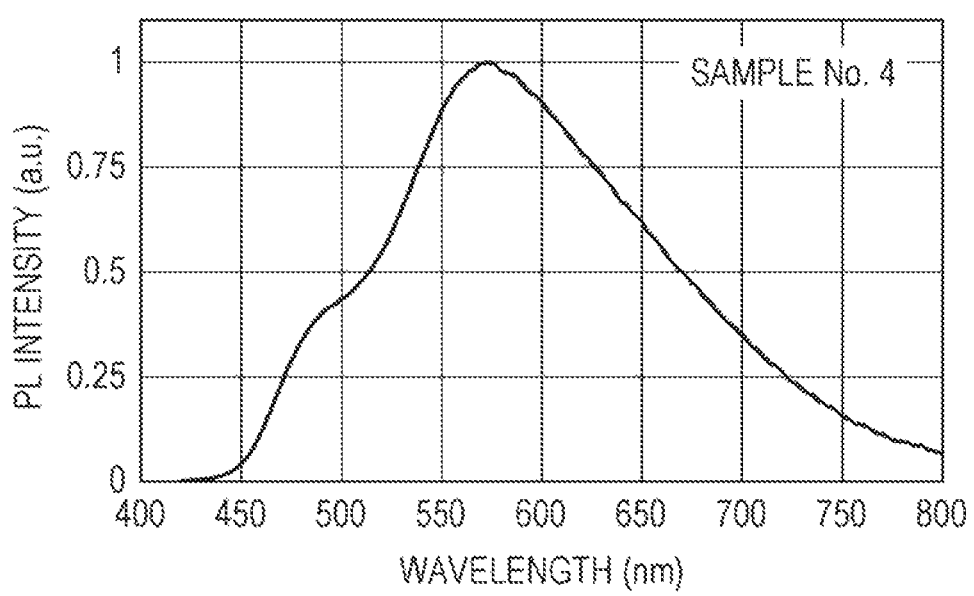
FIG. 7 is an emission spectrum of a phosphor of sample No. 4.
Figure 8:
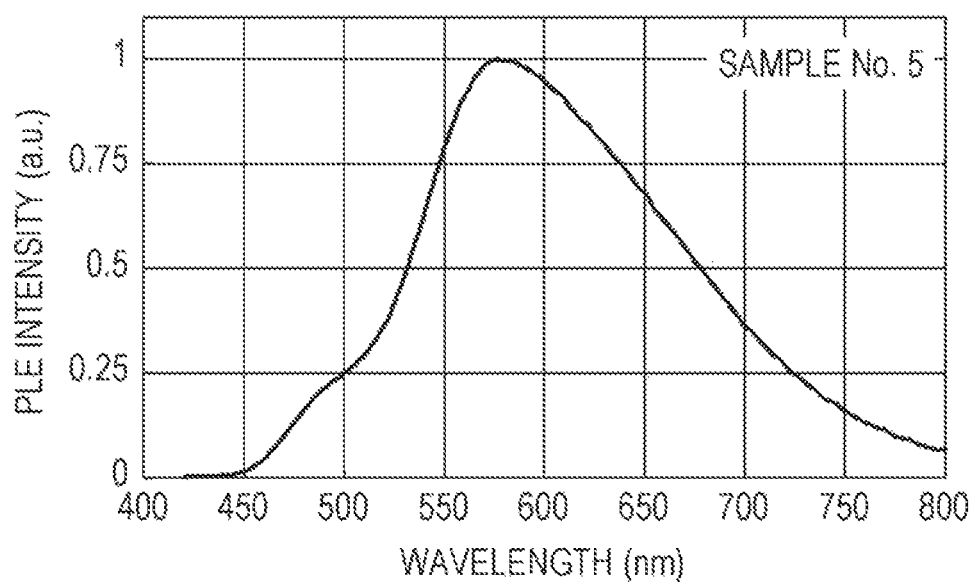
FIG. 8 is an emission spectrum of a phosphor of sample No. 5.
Figure 9:
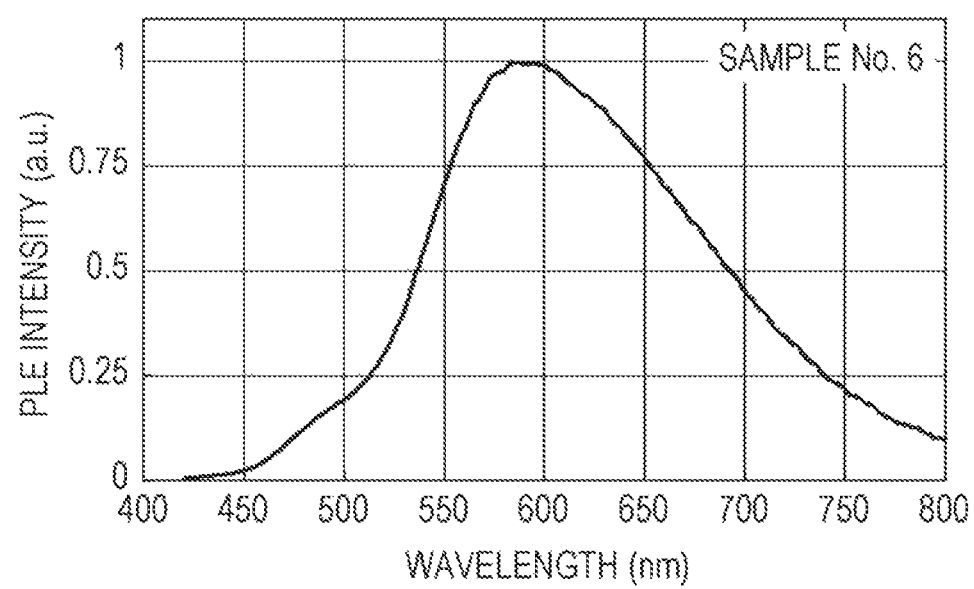
FIG. 9 is an emission spectrum of a phosphor of sample No. 6.
Figure 10:
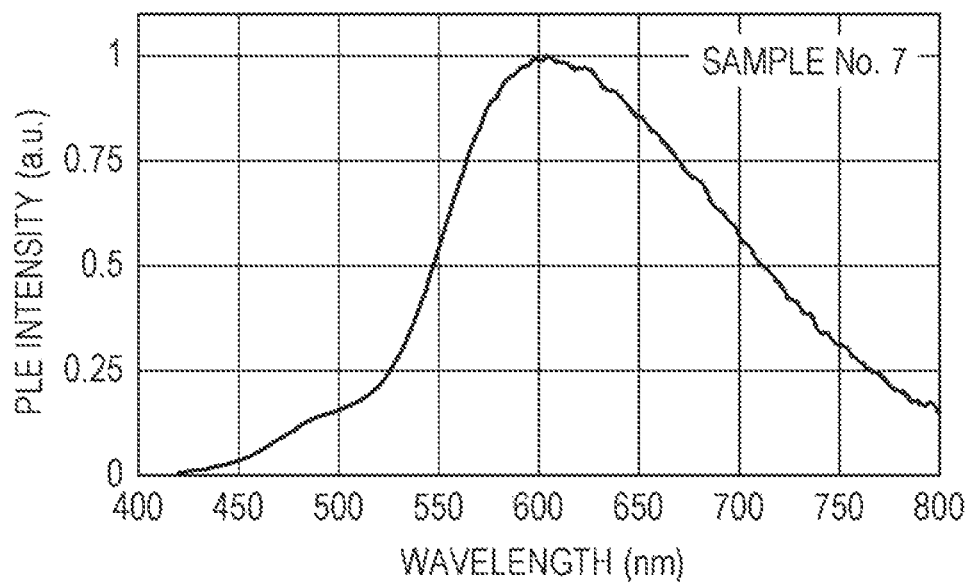
FIG. 10 is an emission spectrum of a phosphor of sample No. 7.
Figure 11:
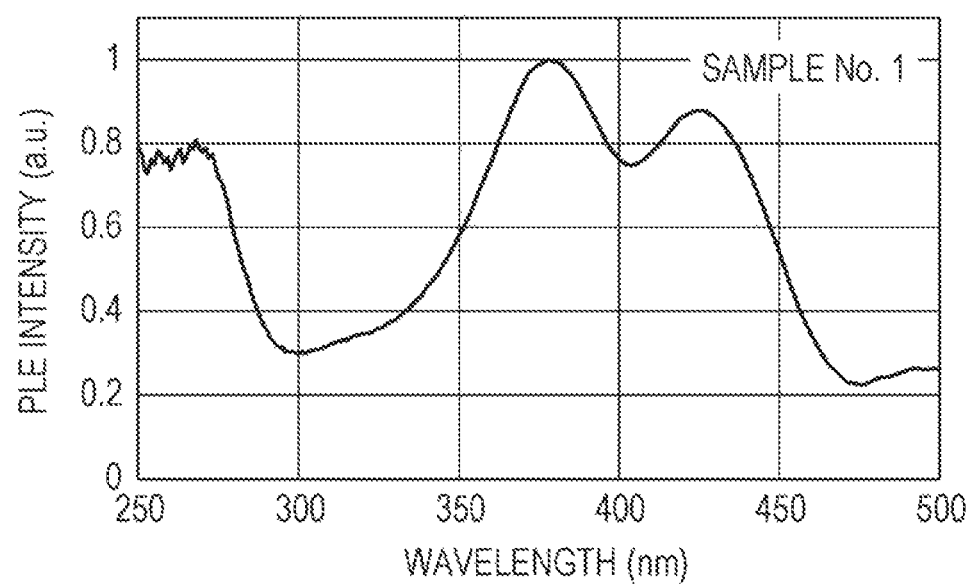
FIG. 11 is an excitation spectrum of the phosphor of sample No. 1.
Figure 12:
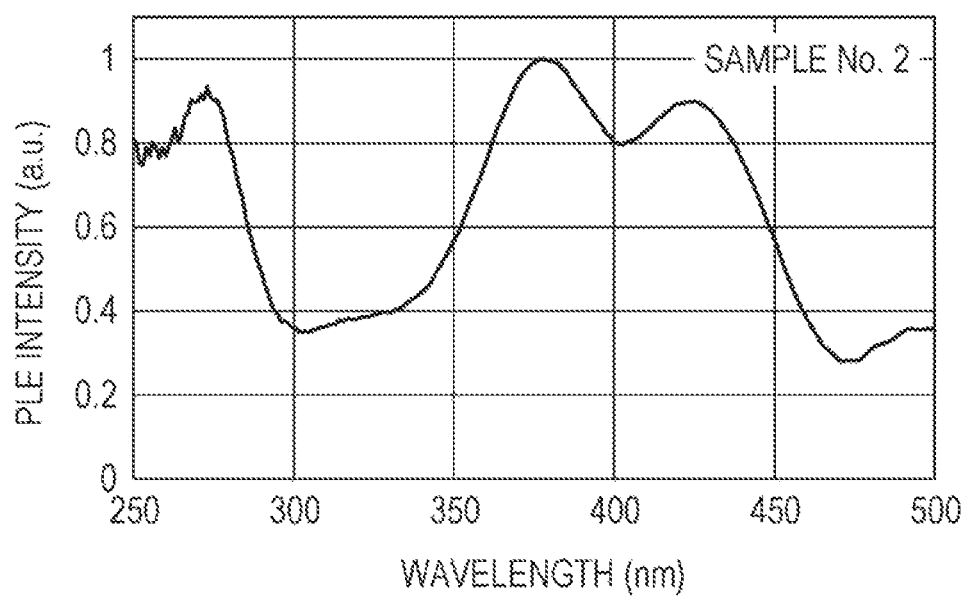
FIG. 12 is an excitation spectrum of the phosphor of sample No. 2.
Figure 13:
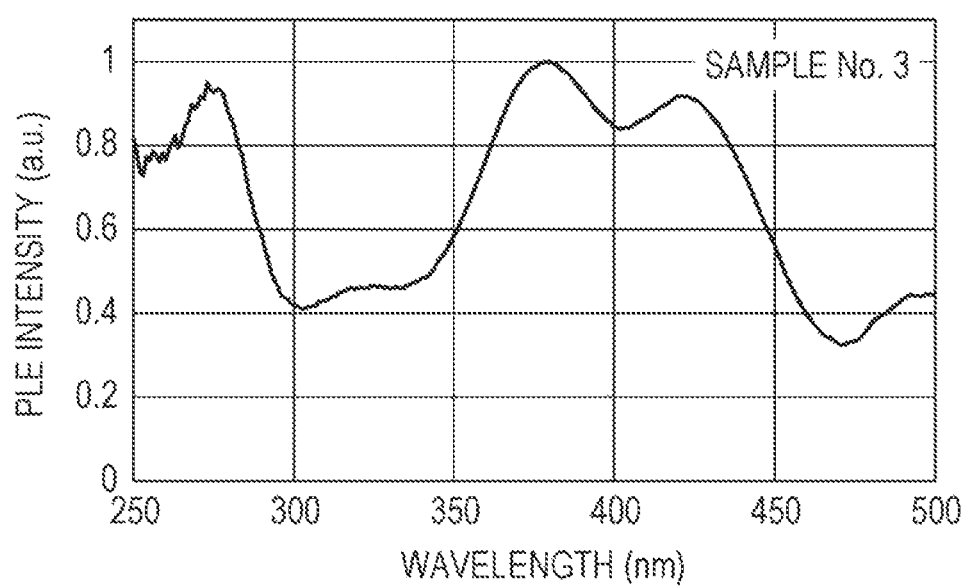
FIG. 13 is an excitation spectrum of the phosphor of sample No. 3.
Figure 14:
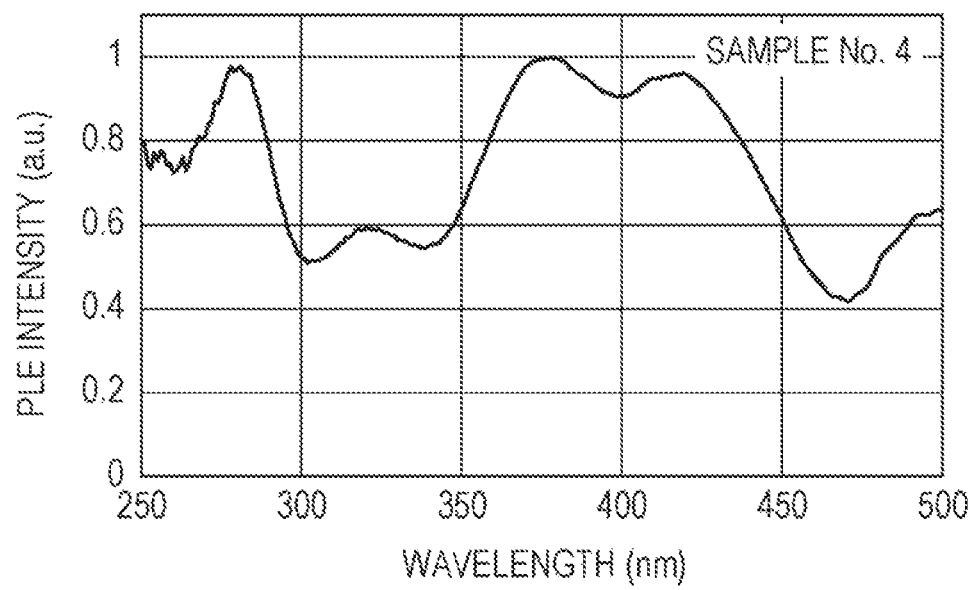
FIG. 14 is an excitation spectrum of the phosphor of sample No. 4.
Figure 15:
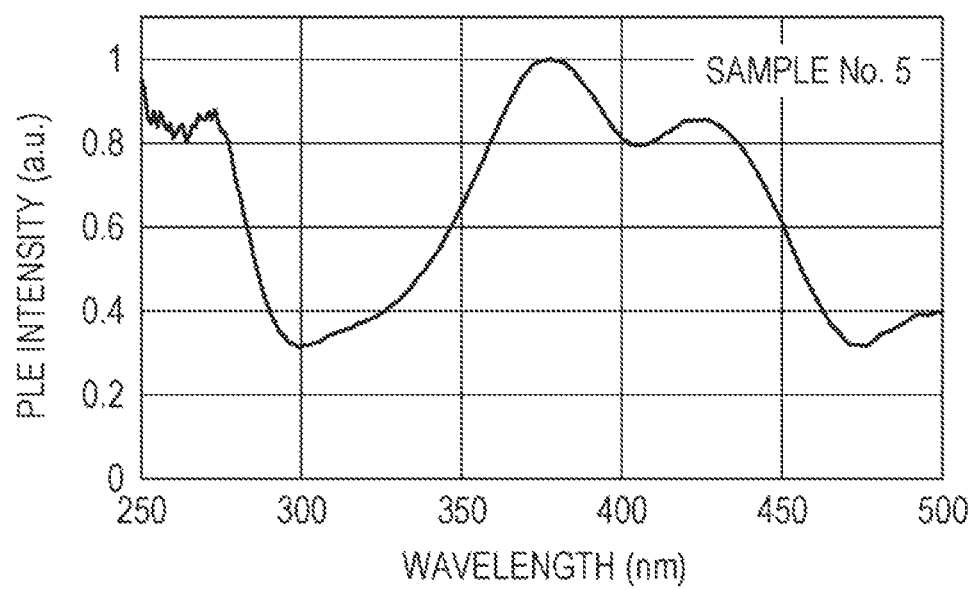
FIG. 15 is an excitation spectrum of the phosphor of sample No. 5.
Figure 16:
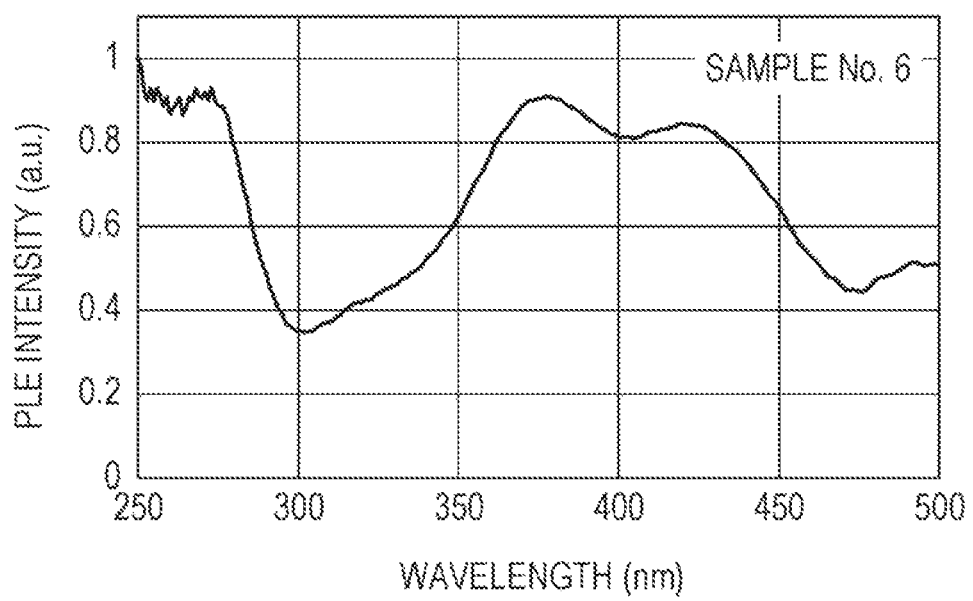
FIG. 16 is an excitation spectrum of the phosphor of sample No. 6.
Figure 17:
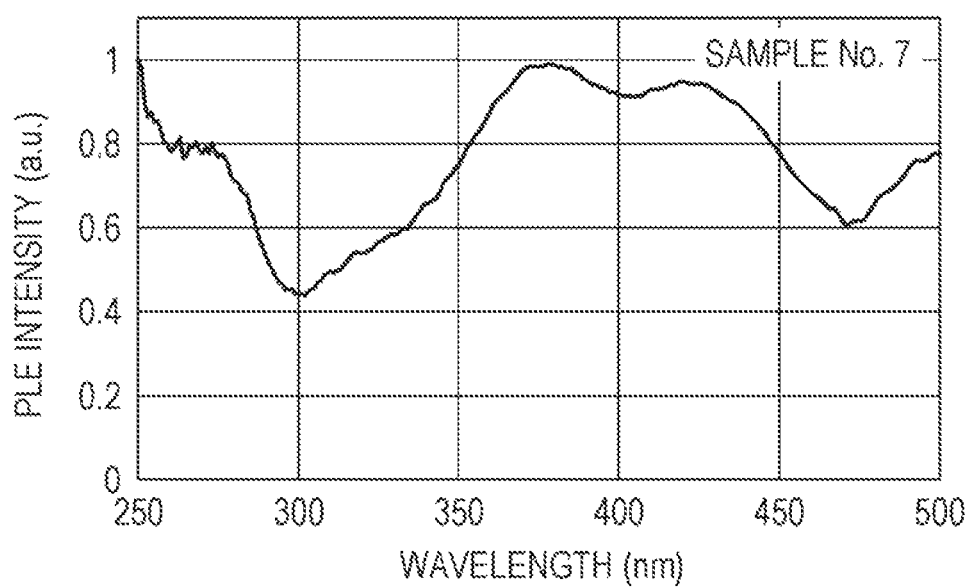
FIG. 17 is an excitation spectrum of the phosphor of sample No. 7.

A lighting apparatus including an optical fiber is described in a fifth embodiment as an example of a lighting apparatus according to the present disclosure. FIG. 3 schematically illustrates a lighting apparatus 130 according to the fifth embodiment. The lighting apparatus 130 includes the LD device 58, the incident optical system 59, an optical fiber 132, a wavelength conversion member 131, and an output optical system 122.

Light from the LD device 58 is directed to the optical fiber 132 through the incident optical system 59. The optical fiber 132 directs the light to an output portion. The output portion includes the wavelength conversion member 131 and the output optical system 122, for example. The wavelength conversion member 131 contains a red phosphor according to the first embodiment. The wavelength conversion member 131 may be the wavelength conversion member 61 according to the fourth embodiment. Although the wavelength conversion member 131 may be closer to the output surface than the optical fiber 132, as illustrated in FIG. 3, the wavelength conversion member 131 may be closer to the incident surface than the optical fiber 132 (for example, between the LD device 58 and the incident optical system 59 or between the incident optical system 59 and the optical fiber 132).

The lighting apparatus according to the fifth embodiment can easily change the emission direction with the optical fiber.

Furthermore, containing a yellow phosphor of the first embodiment, a lighting apparatus of the present embodiment configured as a white-light illumination apparatus can have improved color rendering properties and color reproducibility.

EXAMPLES

Although the present disclosure is described in detail below, the present disclosure is not limited to the following examples.

<Measurement of Emission/Excitation Spectrum>

An emission spectrum and an excitation spectrum of a phosphor were measured with a spectrofluorophotometer (FP-6500 manufactured by JASCO Corporation). An emission spectrum was measured by setting a peak wavelength of excitation light at 380 nm and measuring the light emission of a phosphor at 420 to 800 nm. A peak wavelength was taken as an emission peak wavelength. An excitation spectrum was measured by setting a monitor wavelength of the light emission of a phosphor at 570 nm and changing excitation light from 250 nm to 500 nm.

<Evaluation of Emission Lifetime>

The emission lifetime of a phosphor was measured with a fluorescence lifetime measurement system (Quantaurus-Tau compact fluorescence lifetime measurement system manufactured by Hamamatsu Photonics K.K.). The peak wavelength of excitation light was set at 365 nm. The monitor wavelength of the light emission of a phosphor was set at 570 nm. The change in emission intensity was measured over time after excitation light was blocked. The 1⁄e emission lifetime was determined as the time elapsed before the emission intensity reached 1⁄e times the emission intensity measured before excitation light was blocked.

<Analysis of Crystal Structure>

A powder X-ray diffraction pattern of a phosphor was measured with an X-ray diffractometer (RINT2100 manufactured by Rigaku Corporation). The measurement was performed using Cu—Kα radiation under the conditions listed in Table 1.

TABLE 1

| Start angle | End angle | Sampling width | Scan rate | Tube voltage | Tube current | Divergence slit | Scattering slit | Receiving slit |
|---|---|---|---|---|---|---|---|---|
| 10° | 60° | 0.02° | 8°/min | 40 kV | 40 mA | 1° | 1° | 0.15 mm |

<Synthesis of Phosphor>

A LuN powder, a YN powder, a $Si_3N_4$ powder, and a CeN powder were prepared as starting materials. The LuN powder used as a starting material contained $Lu_2O_3$. $Lu_2O_3$ in the LuN powder was utilized as an oxygen source in the synthesis of a phosphor containing a crystal phase with the chemical composition $(Lu_{1-p-q}, Ce_p, Y_q)_x Si_y N_z O$. The starting material powders for the composition listed in Table 2 were weighed and mixed to synthesize phosphors of sample Nos. 1 to 7. The starting material powders were mixed by dry blending with a mortar in a nitrogen atmosphere in a glove box. The mixed raw powders were placed in a boron nitride crucible. The raw powders were fired in a 0.5 MPa nitrogen atmosphere at 1900° C. for 2 hours. Thus, the phosphors of sample Nos. 1 to 7 were prepared.

<Evaluation of Phosphor>

Figure 18:
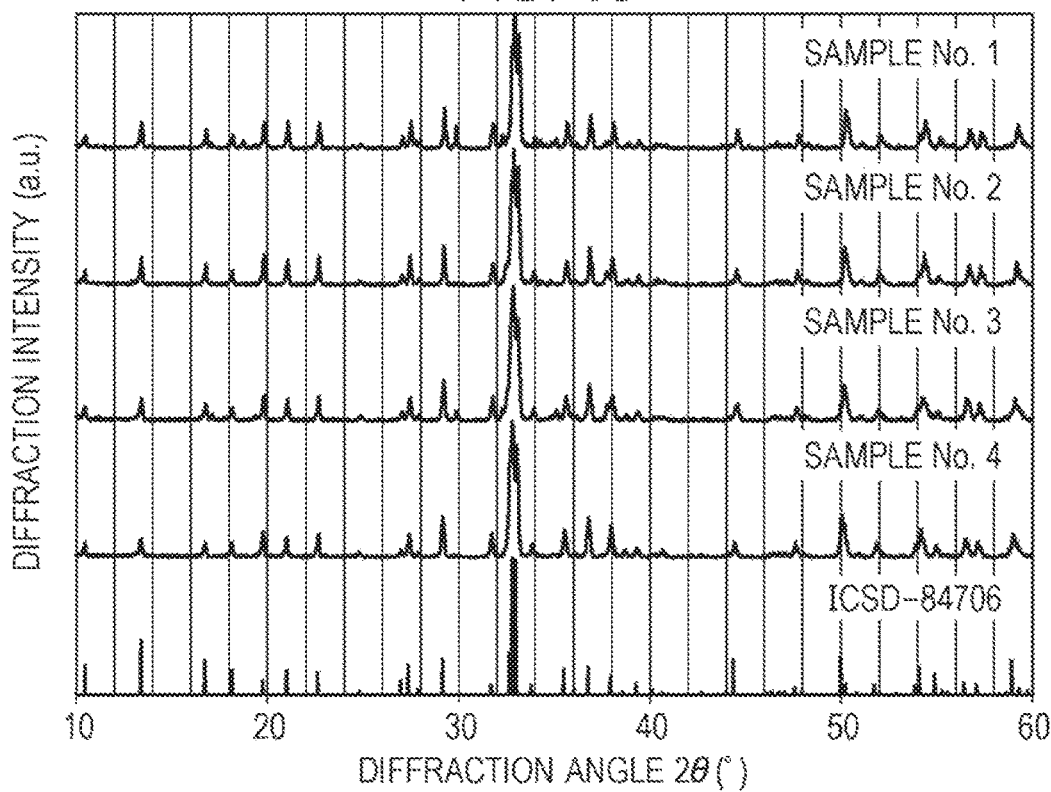
FIG. 18 is powder XRD diffraction patterns of the phosphors of sample Nos. 1 to 4.
Figure 19:
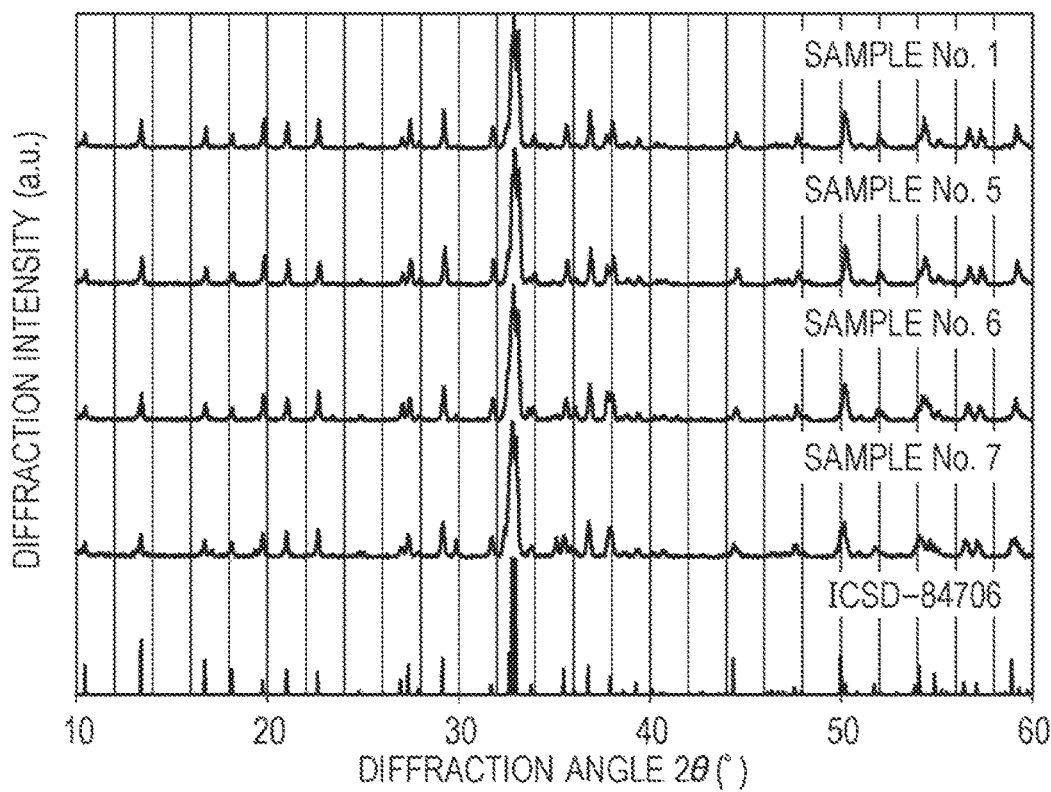
FIG. 19 is powder XRD diffraction patterns of the phosphors of sample No. 1 and sample Nos. 5 to 7.
Figure 20:
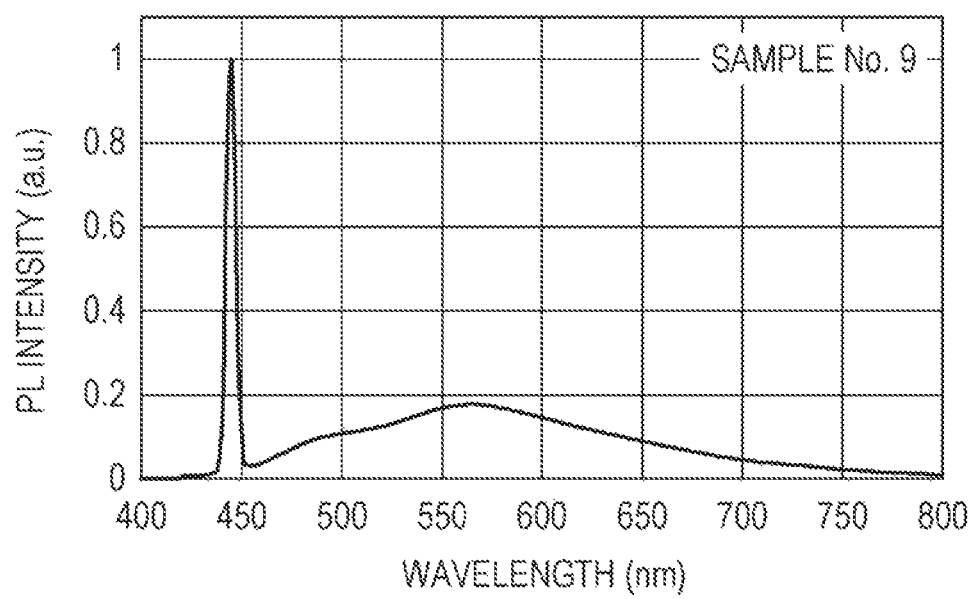
FIG. 20 is an emission spectrum of a white-light source of sample No. 9.
Figure 21:
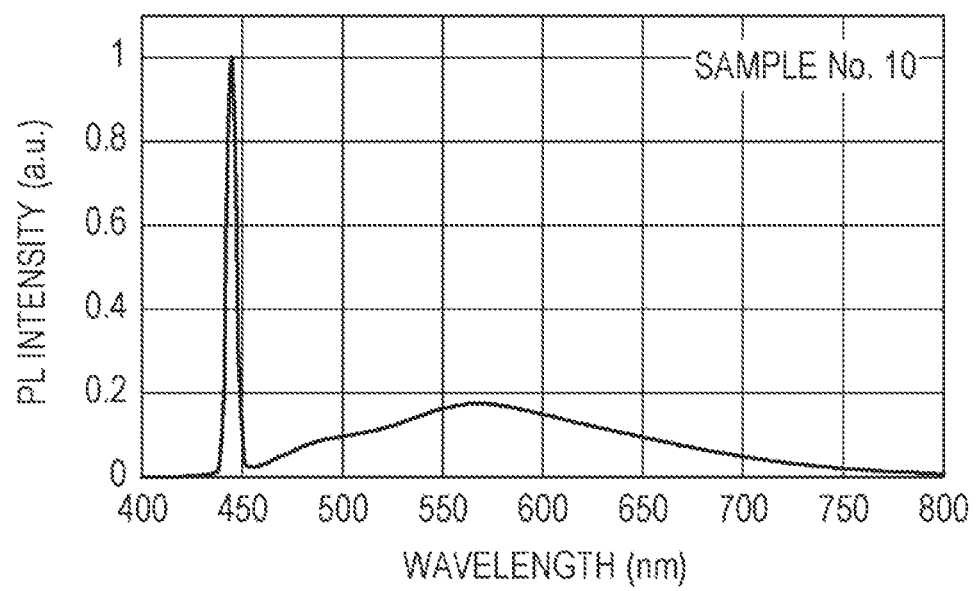
FIG. 21 is an emission spectrum of a white-light source of sample No. 10.
Figure 22:
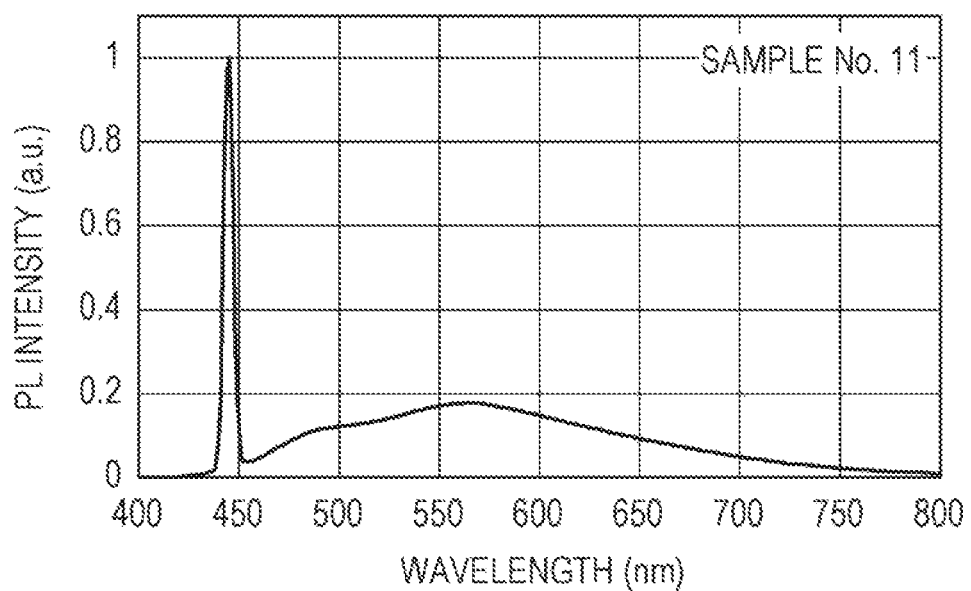
FIG. 22 is an emission spectrum of a white-light source of sample No. 11.
Figure 23:
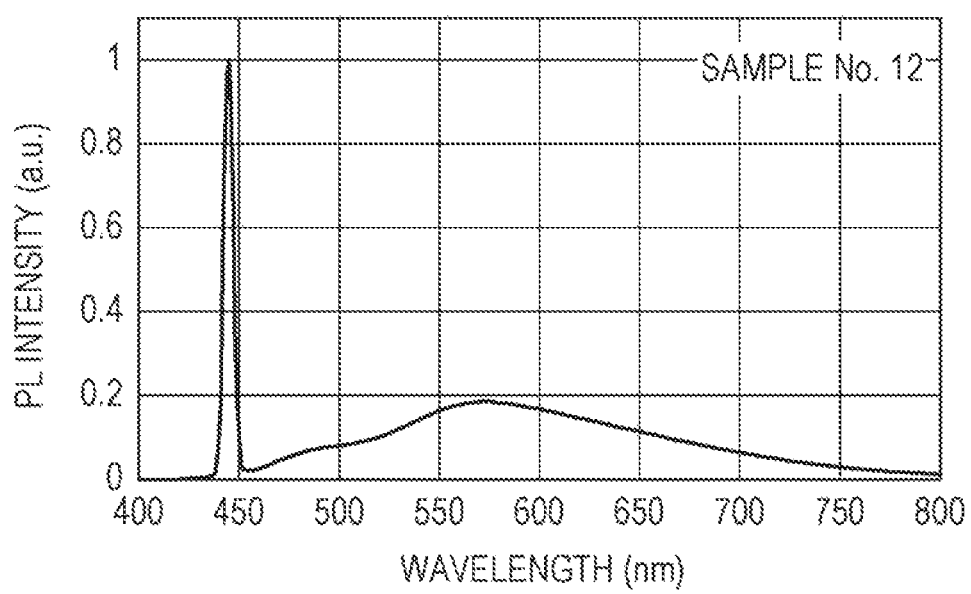
FIG. 23 is an emission spectrum of a white-light source of sample No. 12.
Figure 24:
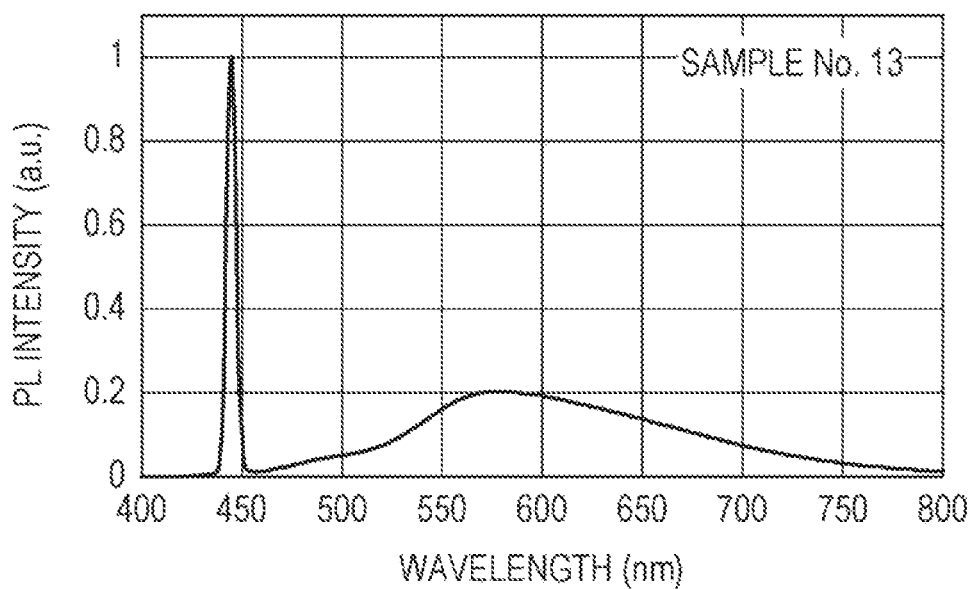
FIG. 24 is an emission spectrum of a white-light source of sample No. 13.
Figure 25:
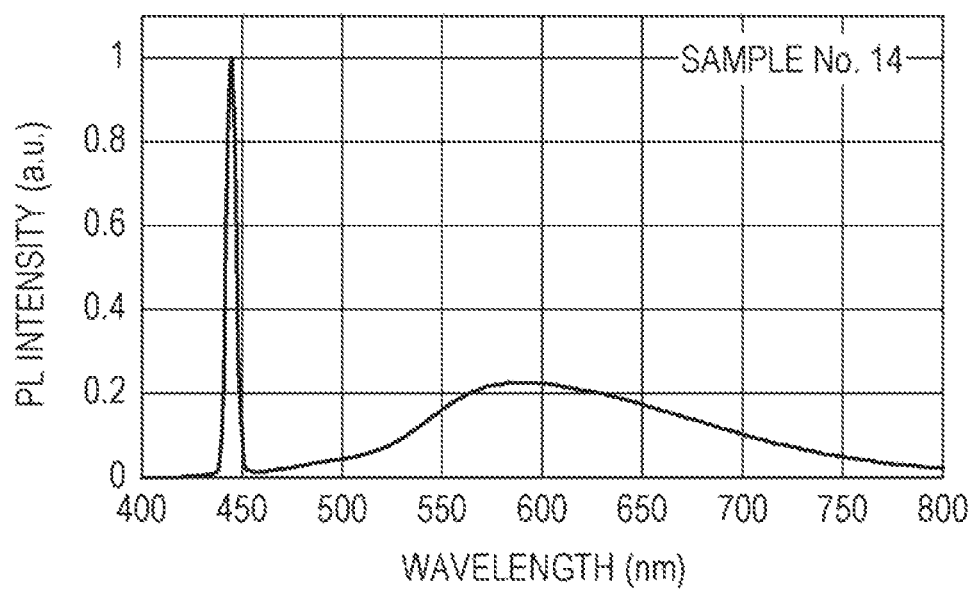
FIG. 25 is an emission spectrum of a white-light source of sample No. 14.
Figure 26:
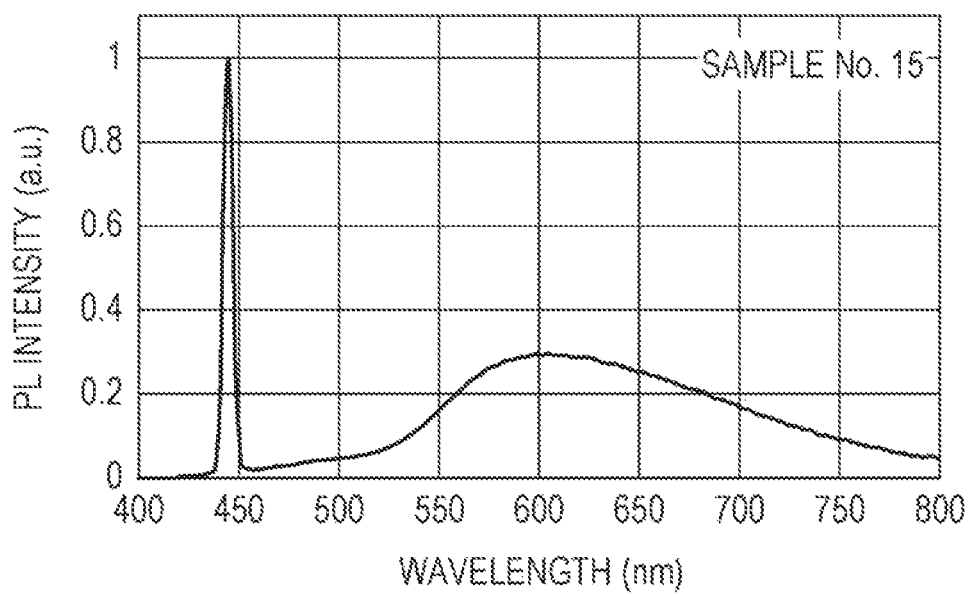
FIG. 26 is an emission spectrum of a white-light source of sample No. 15.
Figure 27:
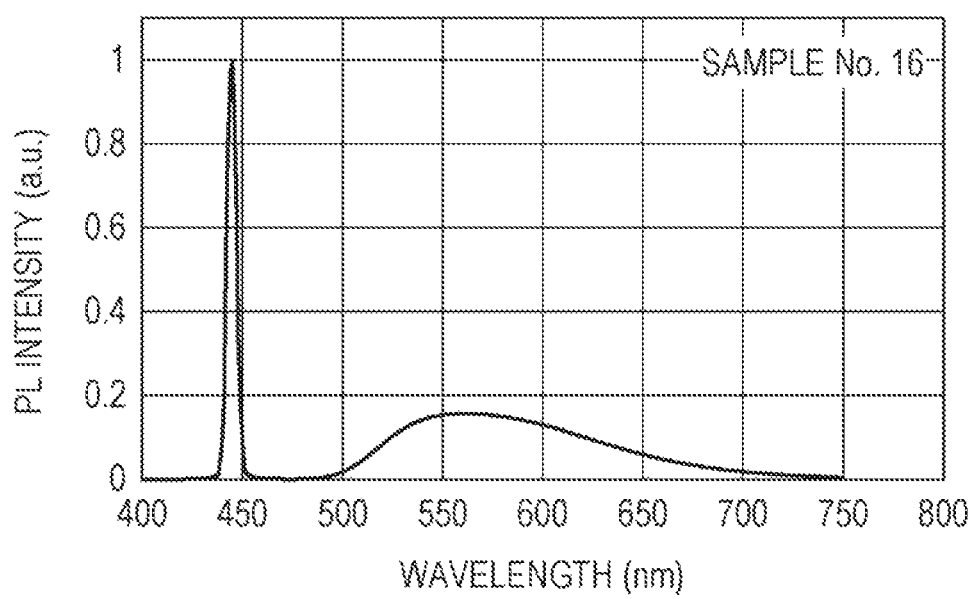
FIG. 27 is an emission spectrum of a white-light source of sample No. 16.

FIGS. 4 to 10 show emission spectra of the phosphors of sample Nos. 1 to 7, respectively. FIGS. 11 to 17 show excitation spectra of the phosphors of sample Nos. 1 to 7, respectively. The ratio of the emission intensity at a wavelength of 500 nm to the emission intensity of the maximum peak (hereinafter referred to as the maximum peak value) and the ratio of the emission intensity at a wavelength of 480 nm to the maximum peak value were determined from the emission spectra. FIGS. 18 and 19 show the XRD patterns of the phosphors of sample Nos. 1 to 7. FIGS. 18 and 19 also show the XRD pattern of $Er_6Si_{11}N_{20}O$ crystal (ICSD-84706) as a comparative example. Table 3 lists the emission peak wavelength, the ratio of emission intensity to maximum peak value, the excitation peak wavelength, the full width at half maximum of an emission peak (the full width at half maximum of light emission), and the 1/e emission lifetime of the phosphors of sample Nos. 1 to 7. The symbol * in Table 3 shows that the sample is a comparative example. Table 3 also lists a YAG phosphor (sample No. 8), which is a generally used yellow phosphor, as a comparative example. YAG was a commercially available phosphor for LEDs. An emission spectrum of YAG was measured at an excitation wavelength of 450 nm.

TABLE 2

| Sample No. | Blend composition | Ce substitution concentration p | Y substitution concentration q | LuN powder (g) | YN powder (g) | $Si_3N_4$ powder (g) | CeN powder (g) |
|---|---|---|---|---|---|---|---|
| 1 | $(Lu_{0.99},Ce_{0.01})_6Si_{11}N_{20}O$ | 0.01 | 0 | 4.133 | 0 | 1.877 | 0.034 |
| 2 | $(Lu_{0.89},Ce_{0.01},Y_{0.1})_6Si_{11}N_{20}O$ | 0.01 | 0.1 | 3.836 | 0.235 | 1.938 | 0.035 |
| 3 | $(Lu_{0.69},Ce_{0.01},Y_{0.3})_6Si_{11}N_{20}O$ | 0.01 | 0.3 | 3.180 | 0.753 | 2.072 | 0.037 |
| 4 | $(Lu_{0.49},Ce_{0.01},Y_{0.5})_6Si_{11}N_{20}O$ | 0.01 | 0.5 | 2.426 | 1.348 | 2.226 | 0.040 |
| 5 | $(Lu_{0.88},Ce_{0.02},Y_{0.1})_6Si_{11}N_{20}O$ | 0.02 | 0.1 | 3.798 | 0.235 | 1.940 | 0.070 |
| 6 | $(Lu_{0.87},Ce_{0.03},Y_{0.1})_6Si_{11}N_{20}O$ | 0.03 | 0.1 | 3.759 | 0.235 | 1.943 | 0.105 |
| 7 | $(Lu_{0.8},Ce_{0.1},Y_{0.1})_6Si_{11}N_{20}O$ | 0.10 | 0.1 | 3.489 | 0.238 | 1.961 | 0.352 |

TABLE 3

| Sample No. | Composition | Emission peak wavelength (nm) | Ratio of emission intensity at wavelength of 480 nm to maximum peak value (%) | Ratio of emission intensity at wavelength of 500 nm to maximum peak value (%) | First excitation peak wavelength (nm) | Second excitation peak wavelength (nm) | Full width at half maximum of light emission (nm) | 1/e emission lifetime (ns) |
|---|---|---|---|---|---|---|---|---|
| 1 | $(Lu_{0.99},Ce_{0.01})_6Si_{11}N_{20}O$ | 565 | 46 | 61 | 378 | 426 | 167 | 46 |
| 2 | $(Lu_{0.89},Ce_{0.01},Y_{0.1})_6Si_{11}N_{20}O$ | 564 | 41 | 55 | 377 | 425 | 168 | 43 |
| 3 | $(Lu_{0.69},Ce_{0.01},Y_{0.3})_6Si_{11}N_{20}O$ | 564 | 55 | 68 | 380 | 421 | 177 | 41 |
| 4 | $(Lu_{0.49},Ce_{0.01},Y_{0.5})_6Si_{11}N_{20}O$ | 572 | 34 | 44 | 378 | 419 | 157 | 44 |
| 5 | $(Lu_{0.88},Ce_{0.02},Y_{0.1})_6Si_{11}N_{20}O$ | 576 | 16 | 25 | 378 | 426 | 147 | 44 |
| *6 | $(Lu_{0.87},Ce_{0.03},Y_{0.1})_6Si_{11}N_{20}O$ | 584 | 12 | 19 | 378 | 419 | 157 | 43 |
| *7 | $(Lu_{0.8},Ce_{0.1},Y_{0.1})_6Si_{11}N_{20}O$ | 604 | 12 | 16 | 379 | 420 | 164 | 42 |
| *8 | $(Y_{3-x},Ce_x)Al_5O_{12}$ | 560 | 0.88 | 12 | 340 | 460 | 117 | 62 |

Yellow light emission with an emission peak wavelength in the range of not less than 540 nm and not more than 600 nm was observed in the phosphors of sample Nos. 1 to 6 and 8. In the phosphors of sample Nos. 1 to 5, the full width at half maximum of light emission was 130 nm or more, the emission intensity at a wavelength of 500 nm was 25% or more of the maximum peak value, and the emission intensity at a wavelength of 480 nm was equal to or more than 15% of the maximum peak value. The phosphors of sample Nos. 1 to 5 satisfied the conditions for the first phosphor A and the first phosphor B described in the second embodiment. These results show that the phosphors of sample Nos. 1 to 5 have an emission spectrum in a wide wavelength region, have a spectrum similar to sunlight (that is, natural light), and emit light containing light having relatively high intensity around 500 nm wavelength. The XRD patterns in FIG. 18 show that the phosphors of sample Nos, 1 to 4 have a peak pattern similar to the peak pattern of $Er_6Si_{11}N_{20}O$ crystal. These results show that crystals with the chemical composition $(Lu_{1-p-q}, Ce_p, Y_q)_xSi_yN_zO$ can be synthesized.

Next, the Ce substitution concentration was examined. A comparison of the phosphors of sample No. 2 and sample Nos. 5 to 7 in FIG. 5, FIGS. 8 to 10, and Table 3 shows that an increase in Ce substitution concentration shifts the emission wavelength toward the longer wavelength. An increase in the Ce concentration (p) of the phosphor results in an increase in overlap of the wave function of the excitation level between Ce atoms. This also results in an increase in excitation level energy width, formation of a band, and a decrease in energy difference from the ground level. An increase in Ce substitution concentration also results in a decrease in the emission intensity of an emission spectrum in the wavelength range of 470 nm or more and less than 520 nm. This is probably due to an increase in self-absorption of the phosphors. Self-absorption means that light in a short-wavelength region out of light emitted from a phosphor is absorbed again by the phosphor.

The XRD patterns in FIG. 19 show that the phosphors of sample Nos. 5 to 7 also have peaks similar to the peaks of $Er_6Si_{11}N_{20}O$ crystal, indicating that crystals with the chemical composition $(Lu_{1-p-q}, Ce_p, Y_q)_xSi_yN_zO$ is synthesized.

<Color Rendering Properties of Light-Emitting Apparatus>

Table 4 shows the color rendering indices of white-light sources including the phosphors of sample Nos. 1 to 8 in combination with a blue LD with an emission peak wavelength of 445 nm. FIGS. 20 to 27 show the emission spectra of sample Nos. 9 to 16, respectively. The chromaticity of white-light emission was adjusted for CIE chromaticity coordinate y=0.345.

TABLE 4

| Sample No. | Composition of phosphor | Sample No. of phosphor | CIE chromaticity coordinate x | CIE chromaticity coordinate y | Color rendering index Ra |
|---|---|---|---|---|---|
| 9 | $(Lu_{0.99},Ce_{0.01})_6Si_{11}N_{20}O$ | 1 | 0.336 | 0.345 | 80 |
| 10 | $(Lu_{0.89},Ce_{0.01},Y_{0.1})_6Si_{11}N_{20}O$ | 2 | 0.345 | 0.345 | 80 |
| 11 | $(Lu_{0.69},Ce_{0.01},Y_{0.3})_6Si_{11}N_{20}O$ | 3 | 0.332 | 0.345 | 82 |
| 12 | $(Lu_{0.49},Ce_{0.01},Y_{0.5})_6Si_{11}N_{20}O$ | 4 | 0.362 | 0.345 | 80 |
| 13 | $(Lu_{0.88},Ce_{0.02},Y_{0.1})_6Si_{11}N_{20}O$ | 5 | 0.390 | 0.345 | 75 |
| *14 | $(Lu_{0.87},Ce_{0.03},Y_{0.1})_6Si_{11}N_{20}O$ | *6 | 0.409 | 0.345 | 76 |
| *15 | $(Lu_{0.8},Ce_{0.1},Y_{0.1})_6Si_{11}N_{20}O$ | *7 | 0.437 | 0.345 | 76 |
| *16 | $(Y_{3-x},Ce_x)Al_5O_{12}$ | *8 | 0.354 | 0.345 | 63 |

White-light sources of sample Nos. 9 to 13 emit white light that satisfies $0.3 \leq x \leq 0.4$ and $0.3 \leq y \leq 0.4$ in the CIE chromaticity coordinates (x, y). Although the white-light sources of sample Nos. 9 to 13 include only one type of phosphor, the color rendering index Ra is 70 or more, indicating white light with improved color rendering properties. Thus, a phosphor according to the present disclosure, even when used alone in a white-light source without another phosphor, can have improved color rendering properties. By contrast, white-light sources of sample Nos. 14 and 15 cannot emit light that satisfies $0.3 \leq x \leq 0.4$ and $0.3 \leq y \leq 0.4$ in the CIE chromaticity coordinates (x, y), though they have improved color rendering properties with a color rendering index Ra of 70 or more.

A phosphor according to the present disclosure is useful in a light-emitting apparatus, for example. For example, a phosphor according to the present disclosure can be used in a light source in a general lighting apparatus, such as a ceiling light, a special lighting apparatus, such as a spotlight, stadium illumination, or studio illumination, a vehicle lighting apparatus, such as a headlight, a projection apparatus, such as a projector or a head-up display, an image pickup apparatus, such as an endoscopic light, a digital camera, a mobile phone, or a smartphone, or a liquid crystal display apparatus, such as a personal computer (PC) monitor, a laptop computer, a television set, a personal digital assistant (PDA), a smartphone, a tablet PC, or a mobile phone.

What is claimed is:

1. A phosphor comprising:
    a crystal phase with a chemical composition $(Lu_{1-p-q}, Ce_p, M_q)_x\beta_y\gamma_zO$, where
    M denotes one or more elements selected from the group consisting of Y, La, Sc, Pr, Nd, Sm, Eu, Gd, Tb, Dy, Ho, Er, Tm, and Yb,
    β contains Si, which constitutes 90% or more by mole of β,
    γ contains N, which constitutes 90% or more by mole of γ, and
    x, y, z, p, and q satisfy 5.5≤x≤6.5, 10.5≤y≤11.5, 19.5≤z≤20.5, 0<p<0.03, and 0≤q≤0.5.

2. The phosphor according to claim 1, wherein the phosphor has an emission spectrum with a peak in a wavelength range of not less than 540 nm and not more than 600 nm.

3. The phosphor according to claim 2, wherein the peak in the emission spectrum is in a wavelength range of not less than 550 nm and not more than 600 nm.

4. The phosphor according to claim 2, wherein the peak in the emission spectrum has a full width at half maximum of 130 nm or more.

5. The phosphor according to claim 2, wherein a wavelength component at 500 nm in the emission spectrum has an intensity that is equal to or more than 25% of the intensity of the peak.

6. The phosphor according to claim 5, wherein the intensity of the wavelength component at 500 nm in the emission spectrum is less than 100% of the intensity of the peak.

7. The phosphor according to claim 1, wherein the phosphor has an excitation spectrum with a first peak in a wavelength range of not less than 360 nm and not more than 390 nm and with a second peak in a wavelength range of not less than 410 nm and not more than 440 nm.

8. The phosphor according to claim 7, wherein an intensity of the first peak is greater than an intensity of the second peak.

9. The phosphor according to claim 1, wherein M contains Y, which constitutes 90% or more by mole of M.

10. The phosphor according to claim 9, wherein
    M is Y,
    β is Si, and
    γ is N.

11. The phosphor according to claim 1, wherein the crystal phase has a 1/e emission lifetime of 100 ns or less.

12. The phosphor according to claim 11, wherein the crystal phase has a 1/e emission lifetime of 50 ns or less.

13. A light-emitting apparatus comprising:
    an excitation light source that emits light having a wavelength in a range of not less than 440 nm and not more than 460 nm; and
    a first phosphor that emits light upon excitation by the light emitted from the excitation light source, the first phosphor being the phosphor according to claim 1.

14. The light-emitting apparatus according to claim 13, wherein the excitation light source is a laser diode (LD).

* * * * *